(12) United States Patent
Katayama

(10) Patent No.: US 8,380,769 B2
(45) Date of Patent: Feb. 19, 2013

(54) FILTER OPERATION UNIT AND MOTION-COMPENSATING DEVICE

(75) Inventor: Yoichi Katayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1181 days.

(21) Appl. No.: 12/237,198

(22) Filed: Sep. 24, 2008

(65) Prior Publication Data
US 2009/0094303 A1   Apr. 9, 2009

(30) Foreign Application Priority Data
Sep. 26, 2007 (JP) ................................ 2007-249082

(51) Int. Cl.
*G06F 17/10* (2006.01)
(52) U.S. Cl. .......................... 708/300; 708/490; 708/505
(58) Field of Classification Search .................. None
See application file for complete search history.

(56) References Cited

U.S. PATENT DOCUMENTS

| | | | | |
|---|---|---|---|---|
| 5,631,848 A | * | 5/1997 | Laczko et al. | 708/203 |
| 5,657,423 A | * | 8/1997 | Benbassat et al. | 704/230 |
| 5,781,462 A | * | 7/1998 | Yamanaka et al. | 708/319 |
| 6,052,706 A | * | 4/2000 | Wheeler et al. | 708/631 |

FOREIGN PATENT DOCUMENTS

| | | |
|---|---|---|
| JP | 6-44291 A | 2/1994 |
| JP | 2004-258141 A | 9/2004 |

* cited by examiner

*Primary Examiner* — Michael D Yaary
(74) *Attorney, Agent, or Firm* — Sughrue Mion, PLLC

(57) ABSTRACT

A filter operation unit that performs a multiply-accumulate operation on input data and a filter coefficient group including a plurality of coefficients using Booth's algorithm. The filter operation unit includes: at least two filter multiplier units that multiply the input data and a difference between adjacent filter coefficients in a filter coefficient group to obtain multiplication results; and an adder that adds the multiplication results of the multiplier units adjacent to each other. The filter multiplier units each include: a partial product generation unit that repeatedly generates a partial product according to Booth's algorithm; and an adder that cumulatively adds the partial products generated by the partial product generation unit.

12 Claims, 13 Drawing Sheets

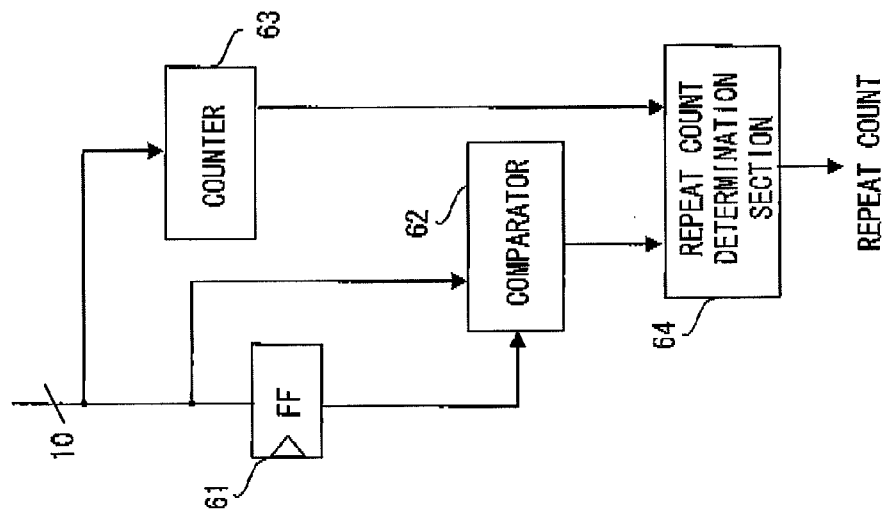
Fig. 10C
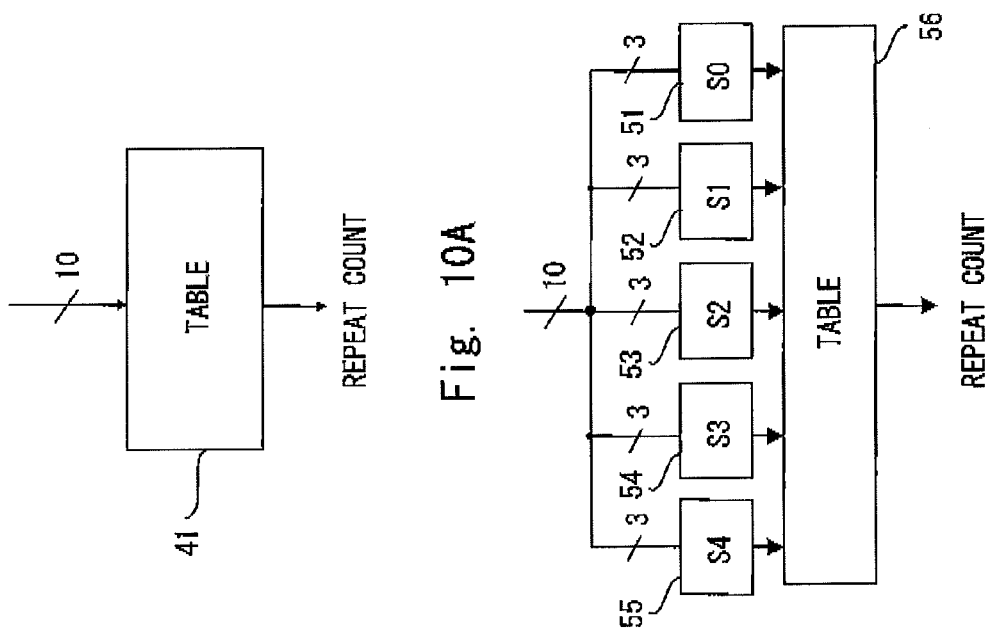
Fig. 10A
Fig. 10B

FILTER OPERATION UNIT AND MOTION-COMPENSATING DEVICE

BACKGROUND OF THE INVENTION

1. Field of the Invention

The present invention relates to a filtering device suitable for carrying out a filter operation during motion compensation processing for compression-encoding/decoding of a moving picture, and a motion-compensating device including the filtering device.

2. Description of Related Art

Latest codecs such as H.264/AVC and VC-1 have been adopted as a standard for next-generation digital versatile disks (DVDs) and digital televisions (DTVs). In such decoding devices, a filter operation of a filter for motion-compensating prediction in a motion-compensating section may be implemented using multipliers to which Booth's algorithm is applied.

An operation time of each multiplier is equal to the sum of a time required for adding partial products to each other and a time required for absorbing a carry signal. To achieve a higher operation speed, it is necessary to reduce the processing times. To reduce the number of adders in order to reduce the processing times, it is necessary to reduce the number of partial products. A multiplier is divided into sets of a plurality of consecutive bits to generate a partial product corresponding to each set, thereby enabling a reduction in the number of partial products. A secondary Booth's algorithm is used to reduce the number of partial products. That is, a multiplier is divided into sets of two bits to form groups of three bits in total including two bits of each set and a most significant bit of a low-order set.

When the filter operation is carried out using the above-mentioned codecs, however, if the filter operation is implemented by the multipliers to which Booth's algorithm is applied, a large number of multipliers are required, leading to an increase in circuit size. Likewise, if the filter operation for generating a predicted image for inter-picture prediction in H.264 is implemented by the multipliers to which Booth's algorithm is applied, the circuit size increases.

Japanese Unexamined Patent Application Publication No. 6-44291 (Endo) discloses a discrete cosine transformer which enables a reduction in circuit size by reducing the number of multipliers as much as possible. FIG. 13 is a diagram showing the discrete cosine transformer disclosed by Endo, The discrete cosine transformer includes adders 612, 640, and 642, a difference calculation unit 610, a register 614, multiplexers 616 and 652, multiplexer-multipliers 618, 620, 622, and 634, butterfly adders 626, 628, 630, 632, 644, 646, 648, and 650, multipliers 624, 636, and 638, and a quantizer 654. Difference data is obtained as an alternating-current component of image data by the difference calculation unit 610, and the difference data thus obtained is subjected to DCT. By performing the DCT on the difference data, the number of necessary coefficients is reduced, resulting in a reduction in the number of multipliers. Furthermore, when the same coefficient is multiplied by different data, the multiplication is executed by time-sharing using the multiplexer-multipliers 618, 620, 622, and 634. Consequently, the number of multipliers can be further reduced. Moreover, when coefficients to be multiplied are multiplied in advance by values contained in a quantization table of the quantizer 654, the number of multiplications is reduced. Thus, the discrete cosine transformer as disclosed by Endo achieves high-speed operation by using characteristics of discrete cosine transform and by using the multiplication and butterfly operation.

Further, Japanese Unexamined Patent Application Publication No. 2004-258141 (Okumura) discloses a multiplication device for shortening a delay time due to a subtraction performed by a block unit arithmetic unit in a circuit that performs multiple precision arithmetic for Montgomery multiplication residue arithmetic, and that performs multiple precision arithmetic with an operation frequency maintained.

The multiplication device performs multiplication of a multiplicand A and a multiplier B that are expressed by bit patterns. The multiplication device includes: a partial product generator that generates a plurality of partial products in the secondary Booth's algorithm from the multiplicand A; an encoder that encodes the multiplier B according to the secondary Booth's algorithm and outputs a selection signal depending on a value "i" specifying three consecutive bits $b_{2i+1}$, $b_{2i}$, and $b_{2i-1}$ of the multiplier B; a selector that selects and outputs one of the plurality of partial products in response to the selection signal; and an adder that adds partial products equal in number to "i" output from the selection circuit, and generates a multiplication result. Further, the multiplication device has an operation mode in which the encoder outputs a selection signal for selecting a partial product indicating −A when "i" is 0, and outputs a selection signal for selecting a partial product indicating 0 when "i" is a value other than 0, and the adder generates a two's complement of the multiplicand A from the partial product indicating −A, and outputs the two's complement of the multiplicand A as the multiplication result.

In the discrete cosine transformer disclosed by Endo, however, a large-scale multiplier is used to carry out multiplication at high speed, which leads to an undesirable increase in circuit size. Further, the discrete cosine transformer performs generic processing without particularly using characteristics of an image. Accordingly, to meet a demand for high operation accuracy, the circuit size of the operation unit increases, which leads to an increase in power consumption. The technique disclosed by Okumura also leads to an undesirable increase in circuit size and power consumption.

SUMMARY

According to an exemplary embodiment of the present invention, there is provided a filter operation unit that performs a multiply-accumulate operation on input data and a filter coefficient group including a plurality of coefficients by using Booth's algorithm, the filter operation unit including: at least two filter multiplier units that perform multiplication of the input data and a difference between the filter coefficients adjacent to each other; and an adder that adds multiplication results of the multiplier units adjacent to each other. In the filter operation unit, the at least two filter multiplier units each include: a partial product generation unit that repeatedly generates a partial product according to Booth's algorithm; and an adder that cumulatively adds outputs from the partial product generation unit.

According to another exemplary embodiment of the present invention, a motion-compensating device is provided that generates a predicted image, including: a first filter operation section that performs a filter operation on input data in a vertical direction; a second filter operation section that performs a filter operation on the input data in a horizontal direction; and a weighting operation section that performs a weighting operation on one of an operation result of each of the first filter operation section and the second filter operation section, and input data input to each of the first filter operation section and the second filter operation section. In the motion-compensating device, each of the first filter operation section and the second filter operation section is a filter operation section that performs a multiply-accumulate operation on the input data and a filter coefficient group including a plurality of coefficients by using Booth's algorithm. Each of the first filter operation section and the second filter operation section includes: at least two filter multiplier units that perform multiplication of the input data and a difference between the filter coefficients adjacent to each other; and an adder that adds multiplication results of the multiplier units adjacent to each other. The at least two filter multiplier units each include: a partial product generation unit that repeatedly generates a partial product according to Booth's algorithm; and an adder that cumulatively adds outputs from the partial product generation unit.

According exemplary embodiments of the present invention, multiplication of input data and a difference between adjacent filter coefficients is performed. Accordingly, when the difference between the adjacent filter coefficients is small, a small calculated value can be obtained. As a result, the circuit size and power consumption can be reduced and processing speed can be enhanced.

According to exemplary embodiments of the present invention, it is possible to provide a filter operation unit and a motion-compensating device capable of reducing the amount of hardware and power consumption by using Booth's algorithm.

BRIEF DESCRIPTION OF THE DRAWINGS

The above and other aspects of the present invention will be more apparent from the following description of exemplary embodiments taken in conjunction with the accompanying drawings, in which:

FIGS. 10A to 10C are diagrams each showing a code data generation section according to an exemplary embodiment of the present invention;

DETAILED DESCRIPTION OF THE EXEMPLARY EMBODIMENTS

The invention will now be described herein with reference to exemplary embodiments. Those skilled in the art will recognize that many alternative embodiments can be accomplished using the teachings of the present invention and that the invention is not limited to the exemplary embodiments described below. Like reference numbers will denote like elements.

According to an exemplary embodiment of the present invention, a filter operation unit is provided that uses Booth's algorithm. The filter operation unit according to an exemplary embodiment of the invention permits a drastic reduction in size of the operation unit by carrying out subtraction of bits encoded by a Booth encoder when calculating a difference between adjacent pixels. The circuit size in a device is reduced by utilizing the fact that a difference between pixel values of the adjacent pixels (current data and previous data) is small.

First, a description is given of an image decoding device to which the filter operation unit according to an exemplary embodiment of the present invention can be applied. In this case, a filter operation unit carries out a filter operation during motion compensation processing for H.264 and VC-1, as an example. A motion compensation circuit capable of performing a filter operation in compliance with the H.264 and VC-1 standards is herein described. Exemplary embodiments of the present invention can also be applied to filter operation units including a motion compensation circuit that performs a filter operation of H.264, a motion compensation circuit that performs a filter operation of VC-1, and other moving picture experts groups (MPEGs) 2 and 4.

Figure 1:
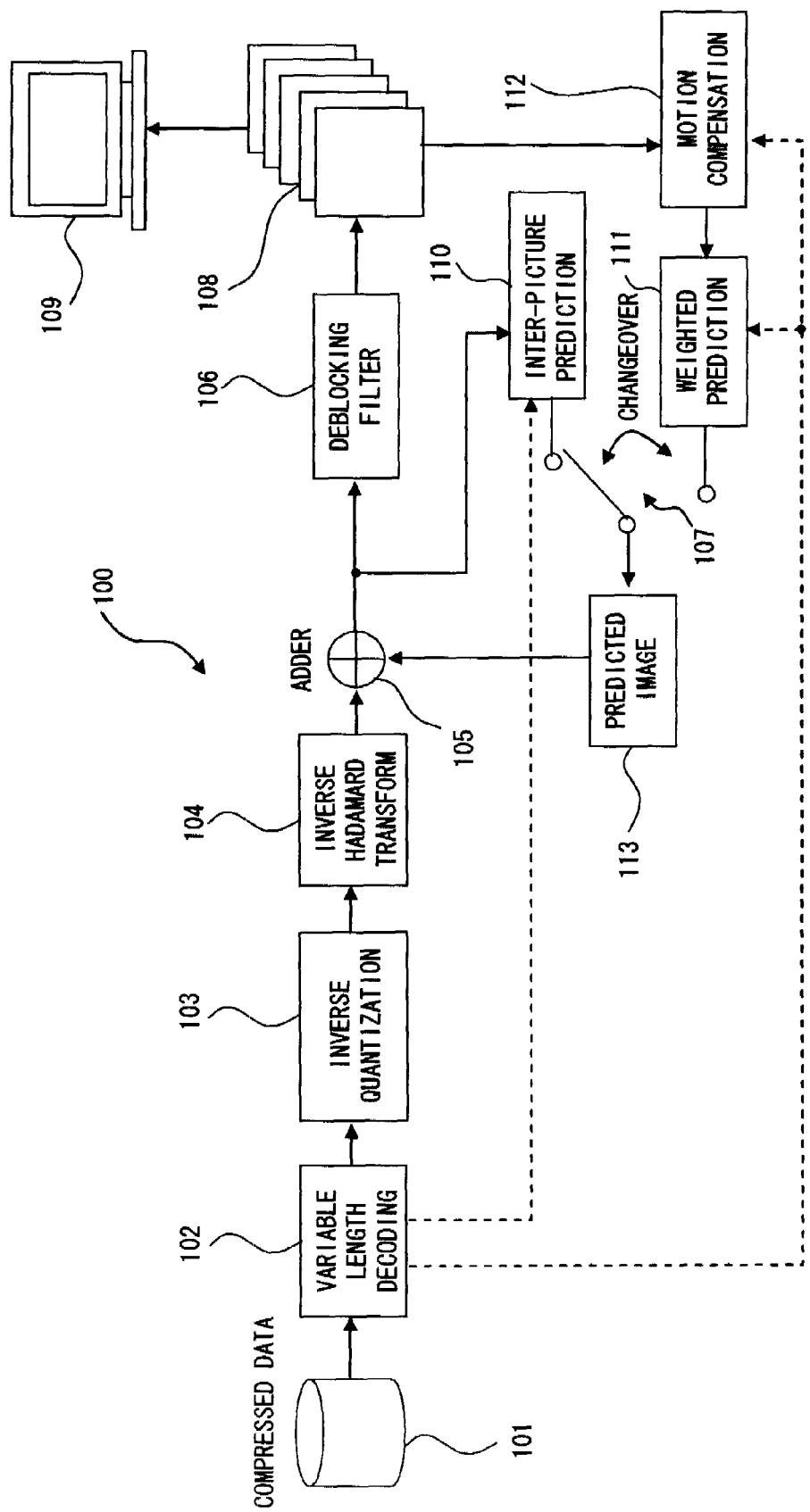
FIG. 1 is a block diagram showing a decoding device that decodes a compressed image encoded in accordance with H.264.
Figure 2:
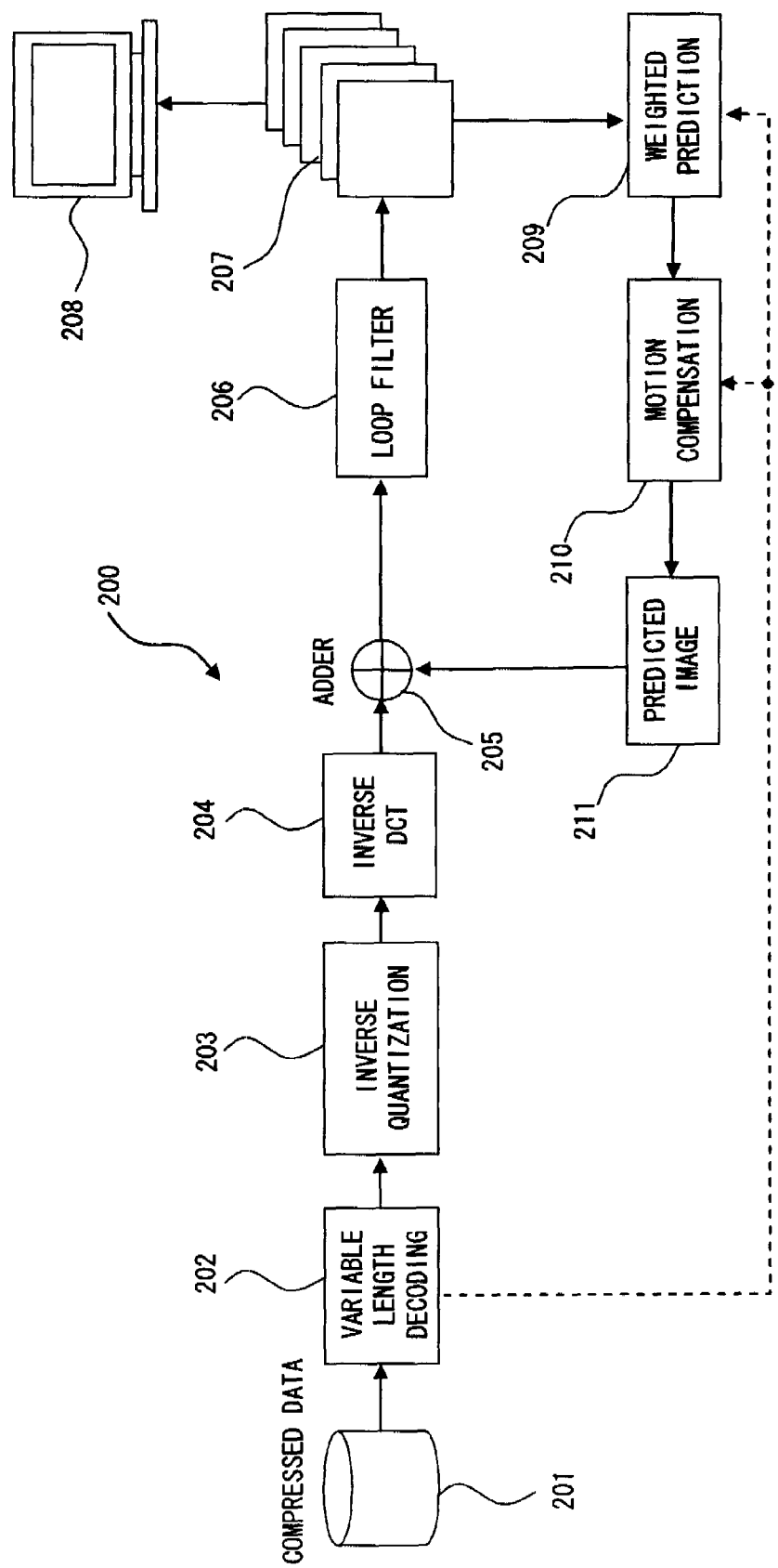
FIG. 2 is a block diagram showing a decoding device that decodes a compressed image encoded in accordance with VC-1.

An image decoding device compliant with the H.264 and VC-1 standards is first described below. FIGS. 1 and 2 are block diagrams each showing a decoding device that decodes a compressed image encoded in compliance with the H.264 and VC-1 standards. H.264 is also referred to as MPEG-4 Advanced Video Coding (AVC), which is a compression coding system with a data compression rate more than twice that of MPEG-2 and more than 1.5 times that of MPEG-4. Further, VC-1 (Windows Media Video (WMV) 9®), which is a moving picture compression technology developed by Microsoft Corporation, has a data compression rate equivalent to that of H.264. These advanced codecs (high-compression codecs) are applied to next-generation DVD standards such as a High Definition DVD (HD DVD) and Blu-ray Disc.

As shown in FIG. 1, an image decoding device 100 compliant with H.264 includes a variable length decoding section 102, an inverse quantization section 103, an inverse Hadamard transform section 104, an adder 105, a deblocking filter 106, a motion-compensating section 112, a weighted prediction section 111, an inter-picture prediction section 110, and a monitor 109 that displays a decoded image 108.

The variable length decoding section 102 receives compressed data 101 and performs variable length decoding of the compressed data subjected to variable length coding, based on a conversion table. The decoded data subjected to variable length decoding is inversely quantized in the inverse quantization section 103. Then, the data is subjected to inverse Hadamard transform in the inverse Hadamard transform section 104 and is sent to the adder 105. Block distortion of the output from the adder 105 is removed by the deblocking filter 106 to thereby obtain the decoded data image 108 displayed on the monitor 109.

In this case, the output of the adder 105 is also input to the inter-picture prediction section 110 to generate a predicted image 113. The decoded data image is subjected to motion compensation processing in the motion-compensating section 112 and is weighted in the weighted prediction section 111 to thereby generate the predicted image 113. In the case of I-frame processing, the adder 105 adds a prediction error to the predicted image 113 sent from the inter-picture prediction section 110 and outputs the addition result. In the case of P-frame or B-frame processing, switching is performed in the switching section 107 and the prediction error is added to the predicted image 113 sent from the weighted prediction section 111, and the addition result is then output.

Further, as shown in FIG. 2, an image decoding device 200 compliant with VC-1 is configured in a similar manner as the image decoding device 100. The image decoding device 200 includes a variable length decoding section 202, an inverse quantization section 203, an inverse DCT section 204, an adder 205, a loop filter 206, a weighted prediction section 209, a motion-compensating section 210, and a monitor 208 that displays a decoded image 207. The image decoding device 200 compliant with VC-1 is different from the image decoding device 100 in that, in the image decoding device 200, the inter-picture prediction is not performed and the motion compensation processing is carried out after the weighted prediction, and the loop filter 206 is used instead of the deblocking filter 106.

Figure 3:
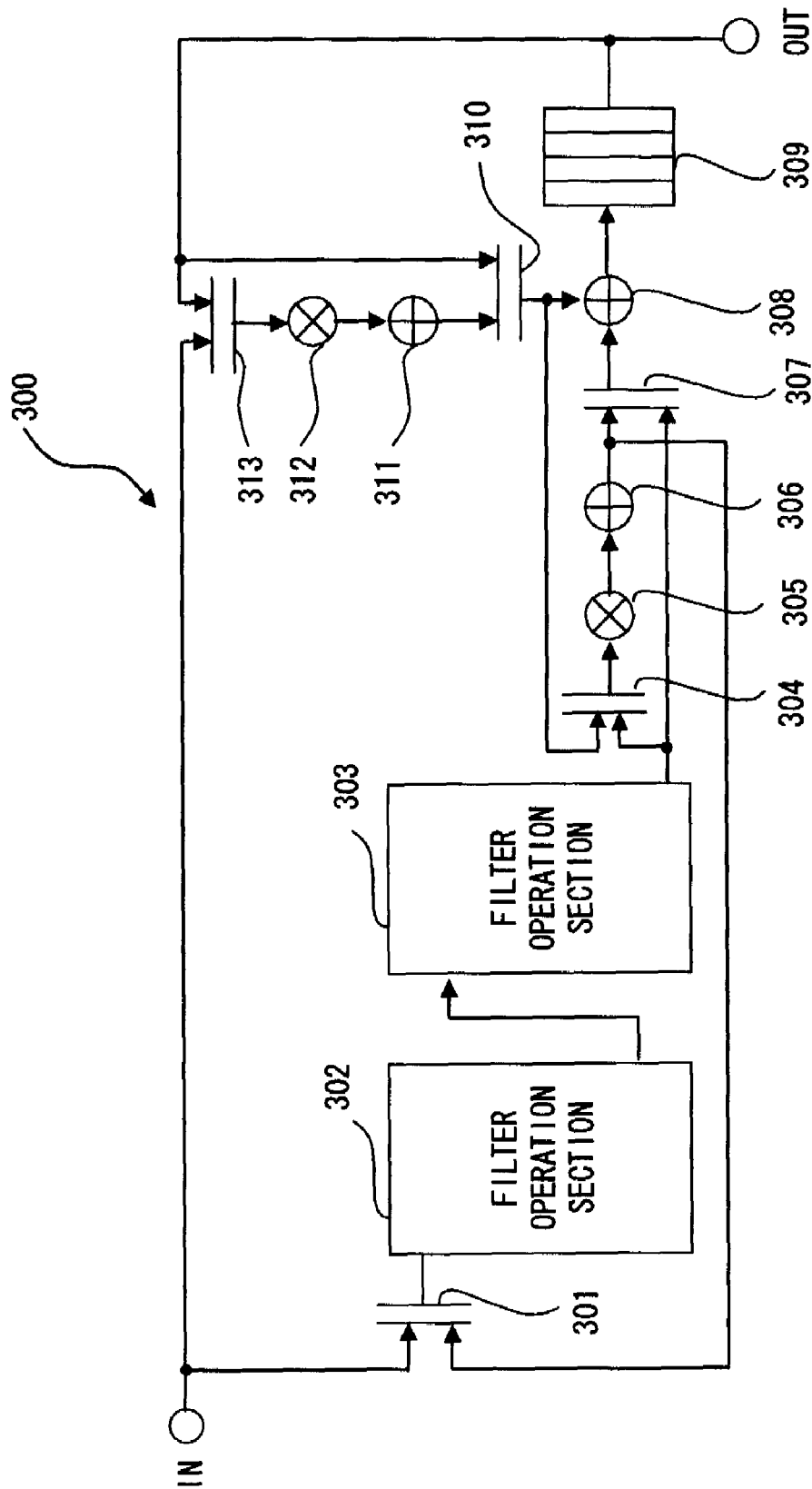
FIG. 3 is a block diagram showing a motion-compensating (MC) section that performs motion compensation processing including a filter operation compliant with H.264 and VC-1.

FIG. 3 is a block diagram showing a motion-compensating (MC) section according to an exemplary embodiment of the invention that performs motion compensation processing including a filter operation in compliance with the H.264 and VC-1 standards. A motion-compensating section 300 can be used as the motion-compensating section compliant with H.264 and also as the motion-compensating section compliant with VC-1. In other words, the motion-compensating section 300 meets both the H.264 and VC-1 standards. The motion-compensating section 300 includes filter operation sections 302 and 303, selectors 301, 304, 307, 310, and 313, multipliers 305 and 312, adders 306, 308, and 311, and a line memory 309.

In the H.264 standard, a filter operation is performed in each of the filter operation sections 302 and 303, and then a weighted interpolation signal with an offset is obtained using the weighting coefficients to thereby obtain a predicted image 211. In this case, pixel values of a reference picture R0 input from an input IN are subjected to a filter operation by a vertical-direction filter in the filter operation section 302 and are further subjected to a filter operation by a horizontal-direction filter in the filter operation section 303. Then, the data generated through the filter operations is stored in the line memory 309. Next, pixel values of a reference picture R1 are input from the input IN, and the pixel values are then subjected to the filter operations in the filter operation sections 302 and 303 in the same manner as described above. The data obtained through the filter operations is multiplied by a weighting factor in the multiplier 305, and an offset value is added to the multiplication result by the adder 306. Meanwhile, the data stored in the line memory 309 passes through the selector 313 and is multiplied by each weighting coefficient by the multiplier 312. Then, the obtained values are added by the adder 308 to thereby generate a weighted interpolation signal with an offset $W_0X_0+W_1X_1+D$. The generated data is output from an output OUT via the line memory 309.

In the VC-1 standard, data input from the input IN is input to the filter operation sections 302 and 303 via the selectors 313 and 310 and via the selector 304, the multiplier 305, the adder 306, and the selector 301. The result obtained by the filter operation section 303 is stored as it is in the line memory 309 via the selectors 304 and 307 and output from the output OUT. The multiplier 312, the adder 311, the multiplier 305, and the adder 306 perform a weighting operation according to the equation $$H=(iScale \times F+iShift+32)>>6$$

where F represents an input value, and iScale and iShift each represent a weighting factor.

The motion-compensating section 300 configured as described above appropriately selects the input/output of the filter operation sections 302 and 303 in the selectors 301, 304, 307, 310, and 313. Accordingly, the motion-compensating section 300 can be applied to the operation for the H.264 standard in which the weighting operation is performed after the filter operation, and also to the operation for the VC-1 standard in which the weighting operation is performed before the filter operation.

Figure 4:
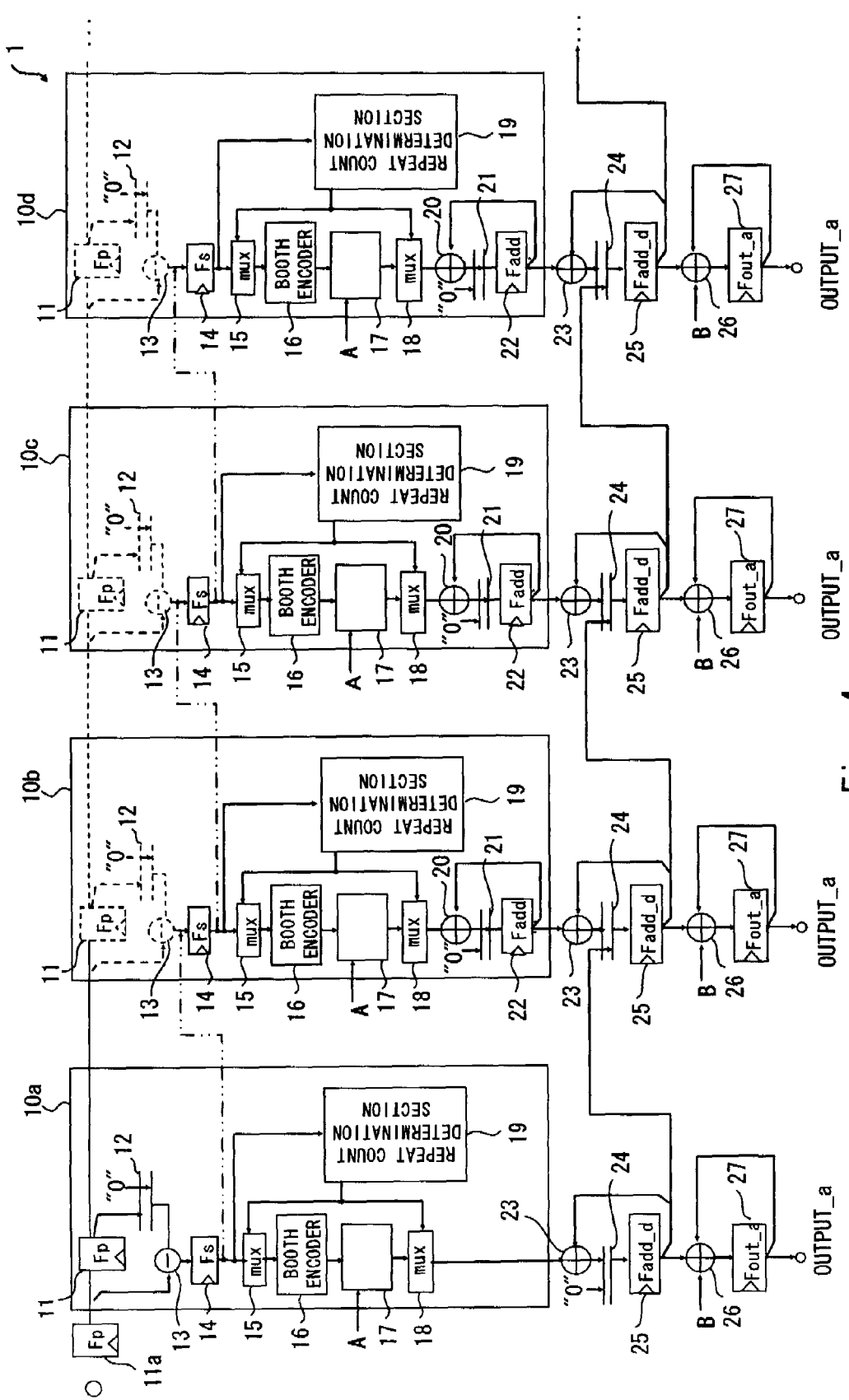
FIG. 4 is a block diagram showing a filter operation unit according to an exemplary embodiment of the present invention.

Next, a filter operation section according to an exemplary embodiment of the invention that can be used in the motion-compensating section and the like is described in detail below. Though the H.264 and VC-1 standards are described above as examples, the filter operation unit according to an exemplary embodiment of the present invention can also be used as a filter operation section for MPEG-4, MPEG-2, and the like. FIG. 4 shows a block diagram of details of the filter operation sections 302 and 303, and also shows a filter operation unit according to an exemplary embodiment of the present invention. Since the filter operation sections 302 and 303 have the same configuration, the filter operation section 302 is herein described. A filter operation unit 1 shown in FIG. 4 includes filter multiplier units 10a, 10b, 10c, .... Though FIG. 4 shows four filter multiplier units, the number of filter multiplier units is not limited to four, and any number of filter multiplier units may be provided depending on the number of filter coefficients. Table 1 below shows filter coefficients for a luminance signal Gy and a color-difference signal Gc in each of the H.264 and VC-1 standards.

TABLE 1

|   | H.264 | | VC-1 | |
|---|---|---|---|---|
|   | Gy | Gc | Gy | Gc |
| 1 | 1 | — | — | — |
| 2 | −5 | — | −4 | −1 | −3 | — |
| 3 | 20 | 0-8 | 53 | 9 | 18 | 0-4 |
| 4 | 20 | 8-0 | 18 | 9 | 53 | 4-0 |
| 5 | −5 | — | −3 | −1 | −4 | — |
| 6 | 1 | — | — | — |

As shown in Table 1, in the H.264 standard, the luminance signal Gy is subjected a 6-tap filter operation, and the color difference signal Gc is subjected to a 2-tap filter operation. In the VC-1 standard, the luminance signal Gy is subjected to a 4-tap filter operation, and the color difference signal Gc is subjected to a 2-tap filter operation. Accordingly, the filter operation unit 1 shown in FIG. 4 includes six filter multiplier units 10a, 10b, and 10c, .... Note that the operation may be repeatedly performed using a single filter multiplier unit. The operation result of each of the filter multiplier units 10a, 10b, 10c, ... is output via an adder 23, a selector 24, a register (Fadd_d) 25, an adder 26, and a register (Fout_a) 27. Among the filter multiplier units 10a, 10b, 10c, ..., the filter multiplier units 10b, 10c, ... have the same configuration, and the subsequent stages of the filter multiplier units 10a, 10b, 10c, ... have the same configuration.

In this case, in the filter operation unit 1 according to an exemplary embodiment of the present invention, the filter multiplier units 10a to 10d perform multiplication of input data and a difference between adjacent filter coefficients. Then, the adder 23 adds multiplication results of the adjacent filter multiplier units. If the difference between the filter coefficients is small, the circuit size can be reduced by calculating the difference. Further, in this case, the filter multiplier unit calculates a difference between current image data and previous image data, thereby additionally reducing the amount of operations and operation time.

In this case, the filter operation unit according to an exemplary embodiment of the present invention is a filter operation unit to perform multiplication using Booth's algorithm. To facilitate understanding of the filter operation unit according to an exemplary embodiment of the present invention, the multiplier using the secondary Booth's algorithm is first described below.

Assuming that a multiplier Y is a signed 8-bit integer given by $$Y = -y[7] \cdot 2^7 + y[6] \cdot 2^6 + y[5] \cdot 2^5 + y[4] \cdot 2^4 + y[3] \cdot 2^3 + y[2] \cdot 2^2 + y[1] \cdot 2^1 + y[0] \cdot 2^0,$$

a product of the multiplier Y and a multiplicand X which is an arbitrary integer, that is, $P = X \times Y$ can be expressed as follows.

[Equation 1]

$$\begin{aligned} P &= X \times Y \quad (1) \\ &= X \times (-y[7] * 2^7 + y[6] * 2^6 + y[5] * 2^5 + y[4] * 2^4 + y[3] * \\ &\quad 2^3 + y[2] * 2^2 + y[1] * 2^1 + y[0] * 2^0) \\ &= X \times \{(-y[7] * 2^7 7 y[6] * 2^6 + 2 * y[5] * 2^5) + \\ &\quad (-y[5] * 2^5 + y[4] * 2^4 + 2 * y[3] * 2^3) + (-y[3] * 2^3 + y[2] * \\ &\quad 2^2 + 2 * y[1] * 2^1) + (-y[1] * 2^1 + y[0] * 2^0 + 2 * 0 * 2^0)\} \\ &= X \times \{(-2 * y[7] + y[6] + y[5]) * 2^6 + (-2 * y[5] + y[4] + \\ &\quad y[3]) * 2^4 + (-2 * y[3] + y[2] + y[1]) * 2^2 + (-2 * y[1] + \\ &\quad y[0] + 0) * 2^0\} \\ &= \sum_{i=0}^{\frac{n}{2}-1} (-2 \cdot y[2i+1] + y[2i] + y[2i-1]) \cdot X \cdot 2^{2i} \end{aligned}$$

Where $y[-1] = 0$

A unit that calculates $(-2 \cdot y[2i+1] + y[2i] + y[2i-1])$ is referred to as a Booth encoder, and $X \times (-2 \cdot y[2i+1] + y[2i] + y[2i-1]) \times 2^{2i}$ is referred to as a partial product. An encode value $(-2 \cdot y[2i+1] + y[2i] + y[2i-1])$ obtained by the Booth encoder is herein referred to as code data. Further, a circuit that generates the partial product $X \times (-2 \cdot y[2i+1] + y[2i] + y[2i-1]) \times 2^{2i}$ is referred to as a partial product generation unit. A circuit that obtains the code data $(-2 \cdot y[2i+1] + y[2i] + y[2i-1])$ of the partial product $X \times (-2 \cdot y[2i+1] + y[2i] + y[2i-1]) \times 2^{2i}$ is referred to as a Booth encoder. A circuit that performs an operation including multiplication of the code data and the multiplicand so as to obtain the partial product is referred to as a multiplication section. A section that performs an operation of $\times 2^{2i}$ of the partial product is referred to as a bit shift section. A circuit that includes the multiplication section and the bit shifter and that generates the partial product corresponding to each value "i" is referred to as a partial product generator.

As shown in Table 2 below, the code data $(-2 \cdot y[2i+1] + y[2i] + y[2i-1])$ takes eight combinations of values of 0, ±1, ±2. Accordingly, the multipliers each can be expressed as a correspondence (truth chart) between combinations of values (partial products) obtained by calculating values (partial products) by multiplying each of 0, ±1, ±2 by $2^{2i}$ and adding the multiplication results. Since the code data takes only eight combinations of values, according to an exemplary embodiment of the invention, the Booth encoder comprises a combination of logic circuits.

TABLE 2

| y[2i + 1] | y[2i] | y[2i − 1] | OUTPUT OF BOOTH ENCODER (−2*y[2i + 1] + y[2i] + y[2i − 1]) | OUTPUT OF PARTIAL PRODUCT GENERATOR |
|---|---|---|---|---|
| 0 | 0 | 0 | 0 | 0 |
| 0 | 0 | 1 | 1 | +X |
| 0 | 1 | 0 | 1 | +X |
| 0 | 1 | 1 | 2 | +2X |
| 1 | 0 | 0 | −2 | −2X |
| 1 | 0 | 1 | −1 | −X |
| 1 | 1 | 0 | −1 | −X |
| 1 | 1 | 1 | 0 | 0 |

Among values 0, ±X, and ±2X, the value 2X can be generated by one-bit shift. On the other hand, a negative value can be generated by inverting each bit of the value X and adding 1 to the least significant bit since the multiplicand X is represented by the two's complement. To realize this, for example, a circuit (Booth encoder) that generates the code data $(-2 \cdot y[2i+1] + y[2i] + y[2i-1])$ generates three signals including two signals for selecting absolute values (0, X, and 2X) of the partial product and one signal for selecting the inversion in response to the input of the multiplier Y. Upon reception of the three signals, the multiplication section selects 0 when the absolute value is 0, selects the multiplicand X when the absolute value is X, and selects the multiplicand X shifted by one bit when the absolute value is 2X. Further, the value is inverted if the inversion is necessary, thereby enabling generation of the partial product. The bit shifter to execute $\times 2^{2i}$ may simply shift a bit line only by 2i.

Figure 5:
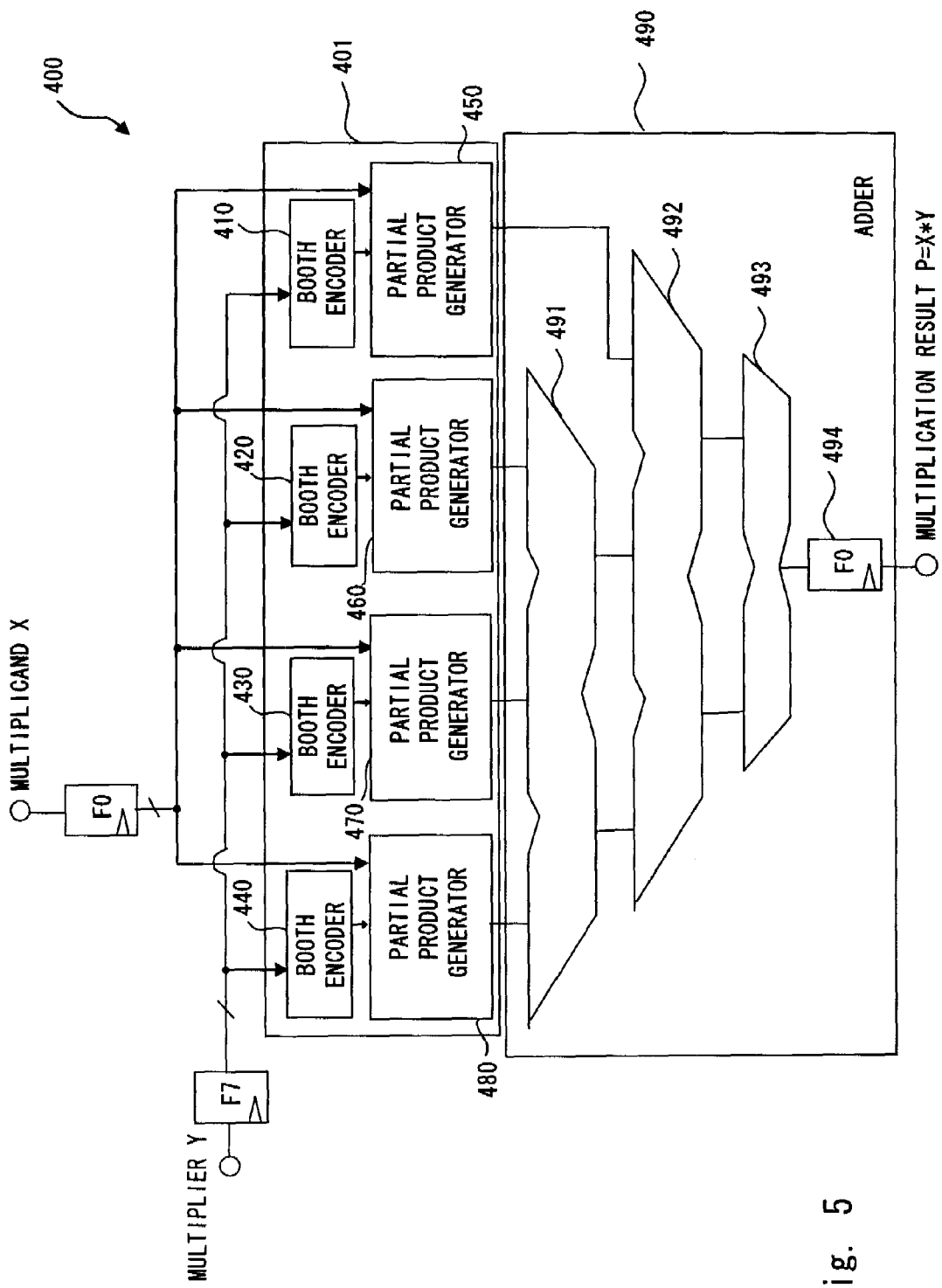
FIG. 5 is a block diagram showing a multiplier that performs multiplication according to a secondary Booth's algorithm.

FIG. 5 is a block diagram showing a multiplier according to an exemplary embodiment of the invention that performs multiplication according to the secondary Booth's algorithm. A multiplier 400 includes a register F0 that outputs the multiplicand X, and a register F7 that outputs the multiplier Y. The multiplier 400 further includes a partial product generation unit 401 receiving the multiplier Y and the multiplicand X that generates partial products, and an adder 490 that adds the partial products generated by the partial product generation unit 401. The partial product generation unit 401 includes four Booth encoders 410, 420, 430, and 440 and four partial product generators 450, 460, 470, and 480.

As described above, each of the Booth encoders 410, 420, 430, and 440 receives predetermined bits of the multiplier Y and generates code data (0, ±1, and ±2) according to Booth's algorithm.

Each of the partial product generators 450, 460, 470, and 480 includes a multiplication section that receives the multiplicand X and outputs a multiplication result of the code data obtained by the Booth encoder and the multiplicand X, and includes a bit shifter that performs bit shift of the operation result of the multiplication section.

Each of the Booth encoders 410, 420, 430, and 440 and each of the partial product generators 450, 460, 470, and 480 correspond to "i" of $X \times (-2 \cdot y[2i+1] + y[2i] + y[2i-1]) \times 2^{2i}$. For example, in the case of 8-bit multiplier Y ($y_0$ to $y_7$), "i" is in a range from 0 to 3. In this case, $(-2 \cdot y_1 + y_0 + 0)$, $(-2 \cdot y_3 + y_2 + y_1)$, $(-2 \cdot y_5 + y_4 + y_3)$, $(-2 \cdot y_7 + y_6 + y_5)$, $X \times (-2 \cdot y_1 + y_0 + 0) \times 2^0$, $X \times (-2 \cdot y_3 + y_2 + y_1) \times 2^2$, $X \times (-2 \cdot y_5 + y_4 + y_3) \times 2^4$, and $X \times (-2 \cdot y_7 + y_6 + y_5) \times 2^6$ are calculated. Referring to FIG. 5, the partial product generators 450, 460, 470, and 480 calculate those partial products. Note that, according to an exemplary embodiment of the present invention, the 8-bit multiplier Y that is encoded by the Booth encoders is illustrated, but multipliers smaller or larger than the 8-bit multiplier can also be used. In this case, the number of the partial product generators may be arbitrarily set.

Figure 6A:
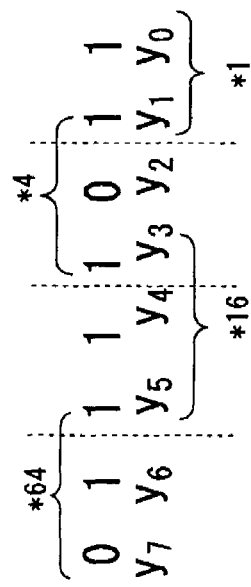
FIG. 6A is a diagram explaining bits used in generation of code data according to Booth's algorithm.
Figure 6B:
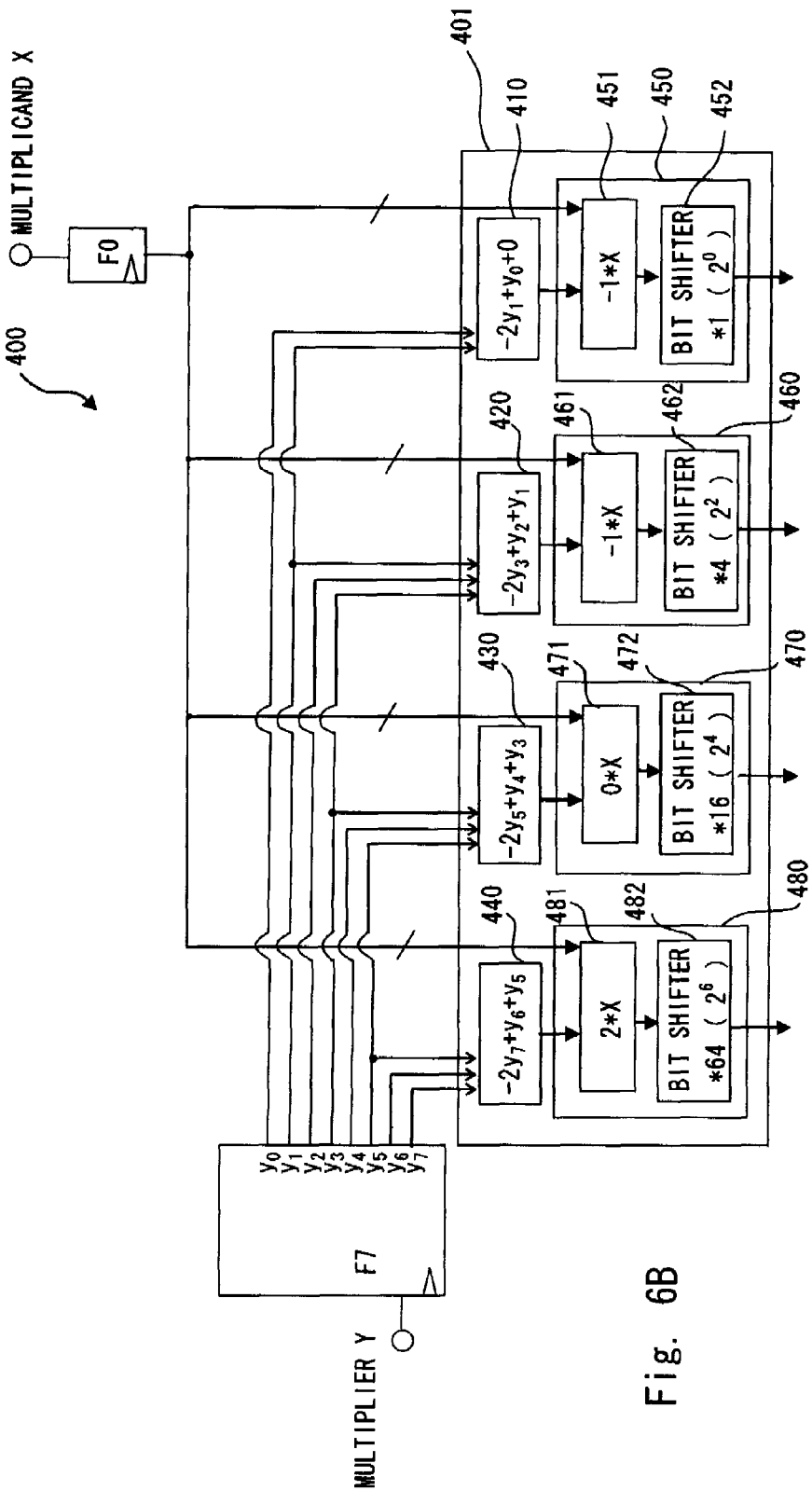
FIG. 6B is a diagram showing details of a partial product generation unit of a multiplier shown in FIG. 1.

Next, the operation of the multiplier 400 will be described by illustrating a practical operation. FIG. 6A shows an exemplary embodiment of the 8-bit multiplier Y. The multiplier is divided into sets of two bits to form groups of three bits in total (where $y_{-1}=0$) including two bits of each set and a most significant bit of a low-order set, thereby obtaining code data. A partial product can be generated by multiplying the code data by the multiplicand X and calculating a corresponding bit shift ($\times 2^i$). Referring to FIG. 6B, the register F7 is formed of a shift register that outputs 8-bit data and outputs the multiplier Y $\{y_0$ to $y_7\}$. In this case, the low-order two bits $\{y_0, y_1\}$ of the multiplier Y are input to the Booth encoder 410, and $\{y_1, y_2, y_3\}$, $\{y_3, y_4, y_5\}$, and $\{y_5, y_6, y_7\}$ are input to the Booth encoders 420, 430, and 440, respectively. The Booth encoder 410 generates code data from the received predetermined bits. The code data thus obtained is input to the corresponding partial product generators 450, 460, 470, and 480. The partial product generators 450, 460, 470, and 480 include multiplication sections 451, 461, 471, and 481, respectively, for multiplying the obtained code data by the multiplicand X, and also include bit shift sections 452, 462, 472, and 482, respectively, for shifting the multiplication result by predetermined bits. In this case, the multiplication of multiplicand X=358 (166H) and multiplier Y=123 (7BH) is described. Table 3 below shows output values used in the operation process.

TABLE 3

| No | CODE DATA $y[2i+1]$ | CODE DATA $y[2i]$ | CODE DATA $y[2i-1]$ | BOOTH ENCODER $(-2 * y[2i+1] + y[2i] + y[2i-1])$ |
|---|---|---|---|---|
| 1 | 0 | 1 | 1 | 2 |
| 2 | 1 | 1 | 1 | 0 |
| 3 | 1 | 0 | 1 | −1 |
| 4 | 1 | 1 | 0 | −1 |
| 5 | | | | |

| No | PARTIAL PRODUCT GENERATOR | OUTPUT OF PARTIAL PRODUCT GENERATOR | OPERATION OF ADDER |
|---|---|---|---|
| 1 | 411 | 2 * X = 02CC H | B300 H |
| 2 | 421 | 0 * X = 0000 H | 0000 H |
| 3 | 431 | −1 * X = FE9A H | FD68 H |
| 4 | 441 | −1 * X = FE9A H | FE9A H |
| 5 | | SUM | AC02 H |

Provided that $$X \times Y = 358 \times 123 = 44034 \; (AC02H)$$
$$Y = 123 \; (7BH)$$
$$= (-2 \cdot 0 + 1 + 1) \cdot 2^6 + (-2 \cdot 1 + 1 + 1) \cdot 2^4 +$$
$$(-2 \cdot 1 + 0 + 1) \cdot 2^2 + (-2 \cdot 1 + 1 + 0) \cdot 2^0$$
$$= 2 \cdot 2^6 + 0 \cdot 2^4 + (-1) \cdot 2^2 + (-1) \cdot 2^0,$$

the following calculations are performed.

$X \times Y = \{(2 \times 358) \times 2^6\}$ ... calculated by the partial product generator 450

$+\{(0 \times 358) \times 2^4\}$ ... calculated by the partial product generator 460

$+\{(-1 \times 358) \times 2^2\}$ ... calculated by the partial product generator 470

$+\{(-1 \times 358) \times 2^0\}$ ... calculated by the partial product generator 480.

First, "358" is input to each of the partial product generators 450, 460, 470, and 480 from the multiplicand input section F0. Then, from the multiplier input section F7, $\{y_0, y_1\}=\{1, 1\}$, $\{y_1, y_2, y_3\}=\{1, 0, 1\}$, $\{y_3, y_4, y_5\}=\{1, 1, 1\}$, and $\{y_5, y_6, y_7\}=\{1, 1, 0\}$ are input to the Booth encoders 410, 420, 430, and 440, respectively. The Booth encoders 410, 420, 430, and 440 output code data corresponding to the operations of $(-2 \cdot y[2i+1] + y[2i] + y[2i-1]) = (-2 \cdot y_1 + y_0 + 0)$, $(-2 \cdot y_3 + y_2 + y_1)$, $(-2 \cdot y_5 + y_4 + y_3)$, and $(-2 \cdot y_7 + y_6 + y_5)$, respectively, from the input predetermined bits. From the above equation, the Booth encoders 410, 420, 430, and 440 output "−1", "−1", "0", and "2", respectively, in this example.

Each of the multiplication sections 451, 461, 471, and 481 performs multiplication of the code data and the multiplicand X, and inputs the obtained results to the bit shift sections 452, 462, 472, and 482, respectively. The bit shifter 452 outputs the obtained result directly to the adder 490. Note that the bit shifter 452 that performs one-bit shift is provided for clarity in this example, but it is not necessary to provide the bit shifter 452. The bit shift sections 462, 472, and 482 shift the obtained results by two bits, four bits, and 6 bits, respectively, and input the obtained values to the adder 490.

The adder 490 according to this exemplary embodiment includes full adders 491 and 492, a half adder 493, and a register 494 that receives a result. Values input from the partial product generators 450, 460, 470, and 480 are added together by the adder 490 and output as a multiplication result P.

When the secondary Booth's algorithm is used in this manner, the multiplier is represented by the code data of 0, ±1, and ±2 multiplied by $2^{2i}$ and the result is multiplied by the multiplicand. As a result, the number of partial products is reduced by about half. Accordingly, the number of partial products to be added by the adder can be reduced by about half, which results in a reduction in size of the multiplier.

Figure 7:
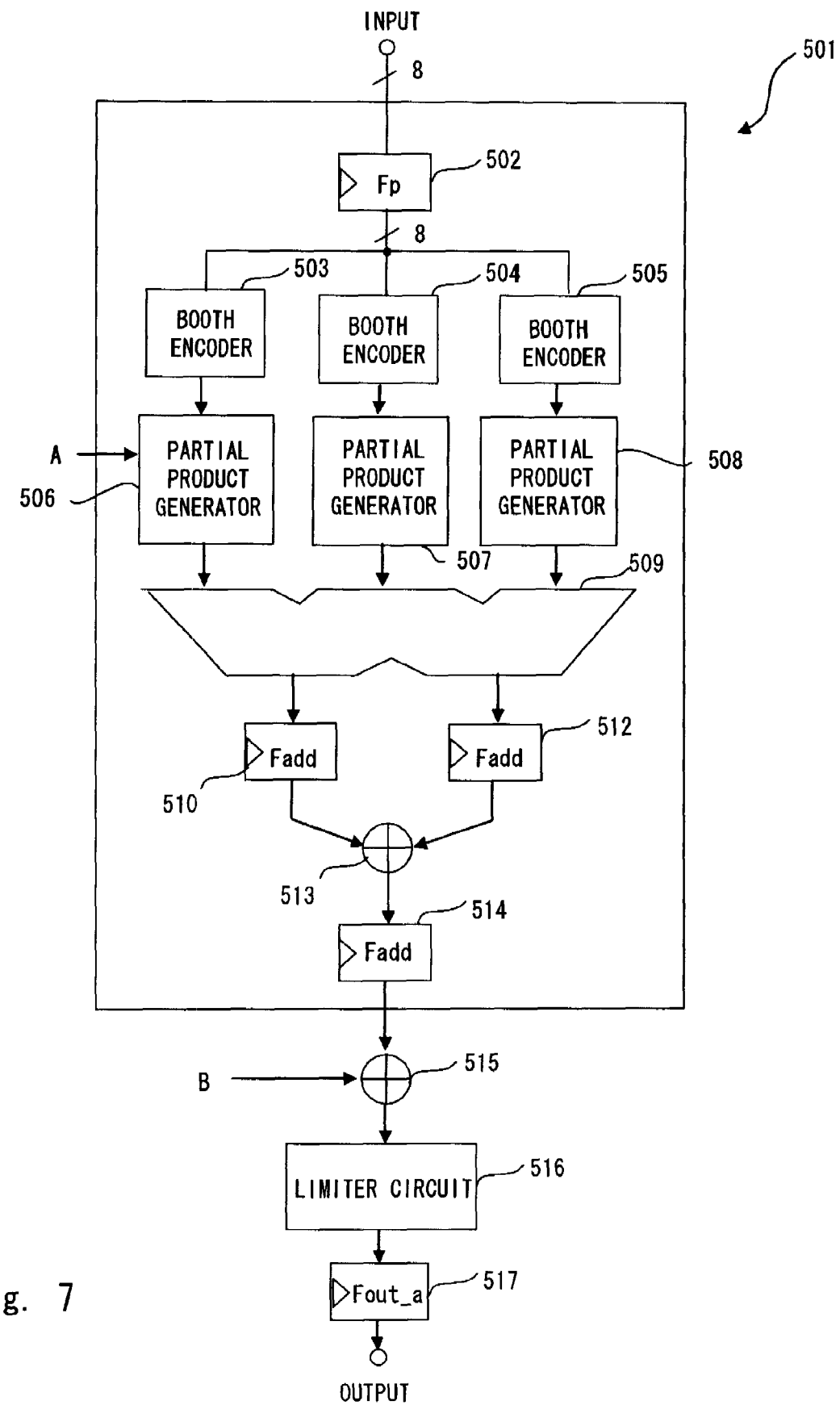
FIG. 7 is a diagram showing a filter operation unit according to the related art.

When the partial product generation unit configured as described above is employed, according to an exemplary embodiment of the invention, the filter operation unit is configured as an arithmetic circuit shown in FIG. 7. FIG. 7 is a diagram showing the filter operation unit having the conventional configuration. Specifically, as described above, in the case of 8-bit data, for example, it is necessary to provide four partial product generators. In the case of 10-bit data, for example, it is necessary to provide five partial product generators. Note that FIG. 7 shows only three partial product generators for ease of explanation.

Briefly referring to FIG. 7, a filter operation unit 501 includes registers (flip-flops: FFs) 502, 510, 512, 514, and 517, Booth encoders 503 to 505, partial product generators 506 to 508, adders 509, 513, and 515, and a limiter circuit 516. Pixel data is input as the multiplier Y and held in the FF 502. The value of the pixel data is input from the FF 502 to the Booth encoders 503 to 505, which are provided corresponding to the number of bits, to thereby generate code data. The code data is input to the corresponding partial product generators 506 to 508 to generate partial products. The adder 509 adds the partial products and inputs high-order bits and low-order bits of the addition result to the FF 510 and the FF 512, respectively. The adder 513 adds a value output from the FF 510 and a value output from the FF 512, and outputs the addition result to the FF 514. The adder 515 adds a value output from the FF 514 and a filter coefficient B, and the limiter circuit 516 limits the value of the adder 515 within a range from 0 to 255, for example, and outputs the limited value to the FF 517.

The filter operation unit executes the following operation:

[output pixel]=Lim([input·pixel]×$A$+$B$)

where A represents a filter coefficient, and B represents a predetermined constant that is added in each filter operation if necessary. In the conventional filter operation unit, data read from an external memory or the like is read in a burst manner. In this case, a high-speed operation is generally performed by a pipeline process using a large-scale multiplier. Accordingly, in the case of 10-bit pixel data, for example, it is necessary to provide five partial product generators, which increases the circuit size and power consumption.

In this case, according to an exemplary embodiment of the present invention, a difference between adjacent filter coefficients is calculated in order to simplify the operation. As a result, it is possible to reduce the circuit size and power consumption. For example, consideration is given to 2D-DCT coding in the case where an image is divided into small blocks (N×N) including N pixels in horizontal and vertical directions, and the divided blocks are each subjected to the 2D-DCT. In this case, N is set in a range from 8 to 16, for example. A 2D-DCT coefficient is given by the following Equation (2):

Equation (2)

$$F(u, v) = \frac{4C(u)C(v)}{N^2} \sum_{j=0}^{N-1} \sum_{k=0}^{N-1} f(j, k) \cos\left\{\frac{(2j+1)u\pi}{2N}\right\} \cos\left\{\frac{(2k+1)u\pi}{2N}\right\} \quad (2)$$

$$C(\omega) = \begin{cases} \frac{1}{\sqrt{2}}, & \omega = 0 \\ 1, & \omega = 1, 2, \ldots, N-1 \end{cases}$$

where N represents a dimension of a conversion efficiency. N=8 is generally used for image processing such as JPEG and MPEG. Further, j and k each represent a variable, and 0=j and k=N−1 are satisfied. Furthermore, f (j, k) represents image data and F (u, v) represents a coefficient (conversion factor) for converting the image data.

The above Equation (2) is converted into the following Equation (3) where N=8:

Equation (3)

$$F(u, v) = \frac{4C(u)C(v)}{64} \sum_{j=0}^{7} \sum_{k=0}^{7} f(j, k) \cos\left\{\frac{(2j+1)u\pi}{16}\right\} \cos\left\{\frac{(2k+1)u\pi}{16}\right\} \quad (3)$$

In this case, when a coefficient cos(2j+1)up/16 is focused, assuming that j=0 to 7 and u represents an integer, coefficient values can be represented as follows. cos(0p/16)=−cos(16p/16)=cos(32p/16)= . . . cos(p/16)=−cos(15p/16)=−cos(17p/16)=cos(31p/16)= . . . cos(2p/16)=−cos(14p/16)=−cos(18p/16)=cos(30p/16)= . . . cos(3p/16)=−cos(13p/16)=−cos(19p/16)=cos(29p/16)= . . . cos(4p/16)=−cos(12p/16)=−cos(20p/16)=cos(28p/16)= . . . cos(5p/16)=−cos(11p/16)=−cos(21p/16)=cos(27p/16)= . . . cos(6p/16)=−cos(10p/16)=−cos(22p/16)=cos(26p/16)= . . . cos(7p/16)=−cos(9p/16)=−cos(23p/16)=cos(25p/16)= . . . cos(8p/16)=−cos(24p/16)=cos(24p/16)= . . .
P0=cos(0p/16)=1
P1=cos(p/16)=0.49039 . . .
P2=cos(2p/16)=0.46194 . . .
P3=cos(3p/16)=0.41573 . . .
P4=cos(4p/16)=0.35355 . . .
P5=cos(5p/16)=0.27778 . . .
P6=cos(6p/16)=0.19134 . . .
P7=cos(7p/16)=0.09754 . . .
P8=cos(8p/16)=0
P0=1
P1=490393/1000000=0011 1110 1100 . . .
P1−P0=28453/1000000=0000 0011 1010 . . .
P2=461940/1000000=0011 1011 0010 . . .
P2−P1=46205/1000000=0000 0101 1111 . . .
P3=415735/1000000=0011 0101 0100 . . .
P3−P2=62182/1000000=0000 0111 1111 . . .
P4=353553/1000000=0010 1101 0100 . . .
P4−P3=75768/1000000=0000 1001 1100 . . .
P5=277785/1000000=0010 0011 1000 . . .
P5−P4=86443/1000000=0000 1011 0001 . . .
P6=191342/1000000=0001 1000 0111 . . .
P6−P5=93797/1000000=0000 1100 0000 . . .
P7=97545/1000000=0000 1100 0111 . . .
P8=0=0000 0000 0000

In this case, values of differences between coefficients (P1−P0, P2−P1, P3−P2, P4−P3, P5−P4, and P6−P5) are smaller than the unchanged values (P0 to P7). In this case, the number of operations to be repeated for P2 is six, and the number of operations to be repeated for P2−P1 is four, for example. Thus, the difference between the adjacent filter coefficients of the filter coefficients, which are multiplicands, is calculated so as to reduce the value of the multiplicand to be multiplied in the partial product generator 17. As a result, high-speed operation and reduction in power consumption can be achieved.

Accordingly, as shown in FIG. 4, the filter multiplier units 10a, 10b, 10c, . . . of the filter operation unit according to an exemplary embodiment of the present invention each include a circuit that adds the operation result of a single filter multiplier unit to the operation result of the adjacent filter multiplier unit. In short, the filter multiplier units 10a, 10b, 10c, . . . each include the adder 23, the selector 24, the register 25, the adder 26, and the register 27.

For example, it is assumed that the filter multiplier units 10a to 10d calculate P0, P1−P0, P2−P1, and P3−P2, respectively. The adder 23 of the filter multiplier unit 10b calculates P0+(P1−P0), thereby obtaining P1. The P1 is input from the register 25 to the selector 24 corresponding to the filter multiplier unit 10c, and the adder 23 calculates (P2−P1)+P1=P2. The adder 26 adds the coefficient B, and also adds the value of the register 27 and the value of the register 25, if necessary, and outputs the addition result to the register 27.

As described above, the filter operation enables a reduction in the amount of operations. In an exemplary embodiment of the present invention, a single partial product generator is repeatedly used instead of the partial product generators 506 to 508 shown in FIG. 7, thereby reducing the circuit size and power consumption.

Referring again to FIG. 4, the filter multiplier units 10a to 10d of the filter operation unit 1 according to an exemplary embodiment of the present invention includes a register 11, a selector 12, a subtracter 13, a register 14, a selector (MUX) 15, a Booth encoder 16, a partial product generator 17, a bit shifter (MUX) 18, and a repeat count determination section 19. Note that, in the filter multiplier units 10b, 10c, and 10d, which are provided subsequent to the filter multiplier unit 10a, the register 11, the selector 12, and the subtracter 13 can be omitted.

The register 11 holds data used to calculate a difference between previous data and current data. Note that the filter operation unit 1 includes a register 11a (Fp0) provided at the pre-stage of the first-stage filter multiplier unit 10a so as to calculate the difference. The selector 12 and the subtracter 13 each calculate a difference between the current data and the previous data. The register (Fs) 14 holds the value of the subtracter 13. The MUX 15 selects bits, which are used to obtain code data, from the value of the register 14. The repeat count determination section 19 determines the number of multiplications performed by the partial product generator 17, based on the value of the register 14. The Booth encoder 16 obtains code data from the bits selected by the selector 15. The partial product generator 17 multiplies the code data by the difference between the filter coefficients. The MUX (bit shift section) 18 bit-shifts the multiplication result. The MUX 15, the Booth encoder 16, the partial product generator 17, the bit shifter 18, and the repeat count determination section 19 form the partial product generation unit to repeatedly generate a partial product according to Booth's algorithm. Further, the MUX 15, the Booth encoder 16, the partial product generator 17, and the bit shifter 18 form the partial product multiplication section to multiply the subtraction result output from the subtracter by the difference between the filter coefficients.

In addition, according to an exemplary embodiment of the invention, a counter, a selector, an increment, and the like may be provided to increment the repeat count after the repeat count is determined. Furthermore, the filter multiplier units except the filter multiplier unit 10a include: an adder 20 that cumulatively adds accumulation results of the previous data and the current partial multiplication result; a selector 21 that selects "0" or the addition result of the adder 20; and a register (Fadd) 22 that holds the selection result of the selector 21.

The filter operation unit 1 does not necessarily receive data continuously, since the data sent from the external memory is generally transferred in bursts. Further, adjacent pixels of image data are relatively correlated with each other, so a difference between the pixels is relatively small. By utilizing the above-mentioned features, a large reduction in circuit size can be achieved with a small partial product generator. At the same time, the processing can be carried out without causing considerable deterioration in performance. This is because the data is output substantially continuously when the difference between the current data and the previous data is small, and even if the difference is exceptionally large and the multiplication time is prolonged, there is a time interval between the burst data. Furthermore, the reduction in circuit size results in a reduction in power consumption.

Figure 8:
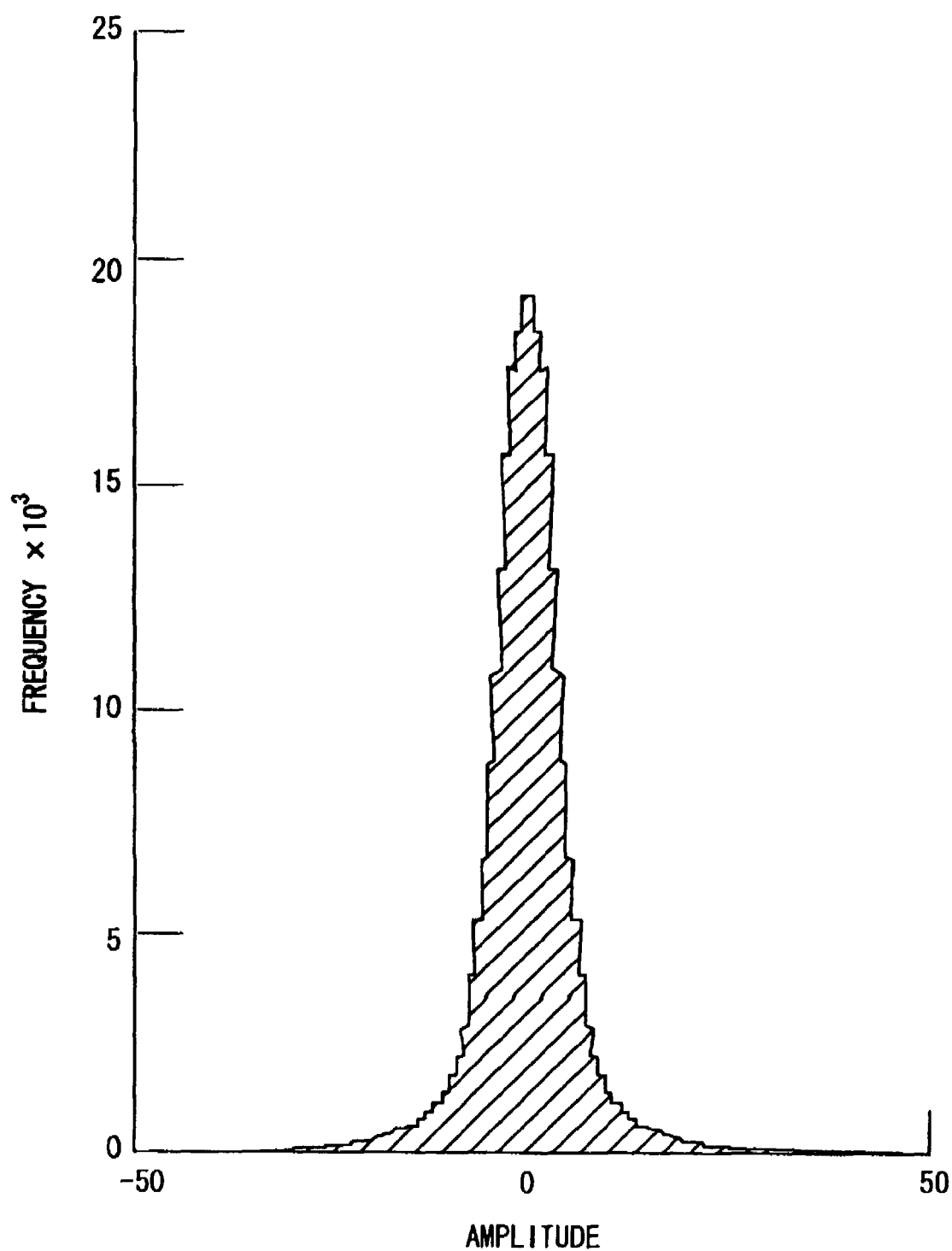
FIG. 8 is a graph showing an amplitude distribution of a difference signal between pixels adjacent to each other in a horizontal direction with respect to an image.

The filter operation unit 1 according to an exemplary embodiment of the present invention will be described below in more detail. The subtracter 13 subtracts the previous image data, which is held in the FF 11, from the input current image data, thereby obtaining difference data. The reason for obtaining the difference data is described below. FIG. 8 is a graph showing an amplitude distribution of a difference signal between pixels adjacent to each other in the horizontal direction with respect to an image ("Image Information Compression", The Journal of the Institute of Television Engineers of Japan, P. 71). An axis of abscissa represents an amplitude, and an axis of ordinate represents a frequency. The difference signal is centered in a narrow range around 0. Accordingly, the subtracter 13 generates a difference signal so as to obtain a value close to 0. By setting the input data to the value close to 0 as the difference data, the number of repetitions of the operation to be described later can be minimized, and the arithmetic processing time can be reduced. The value is held in the Fs 14.

Figure 9:
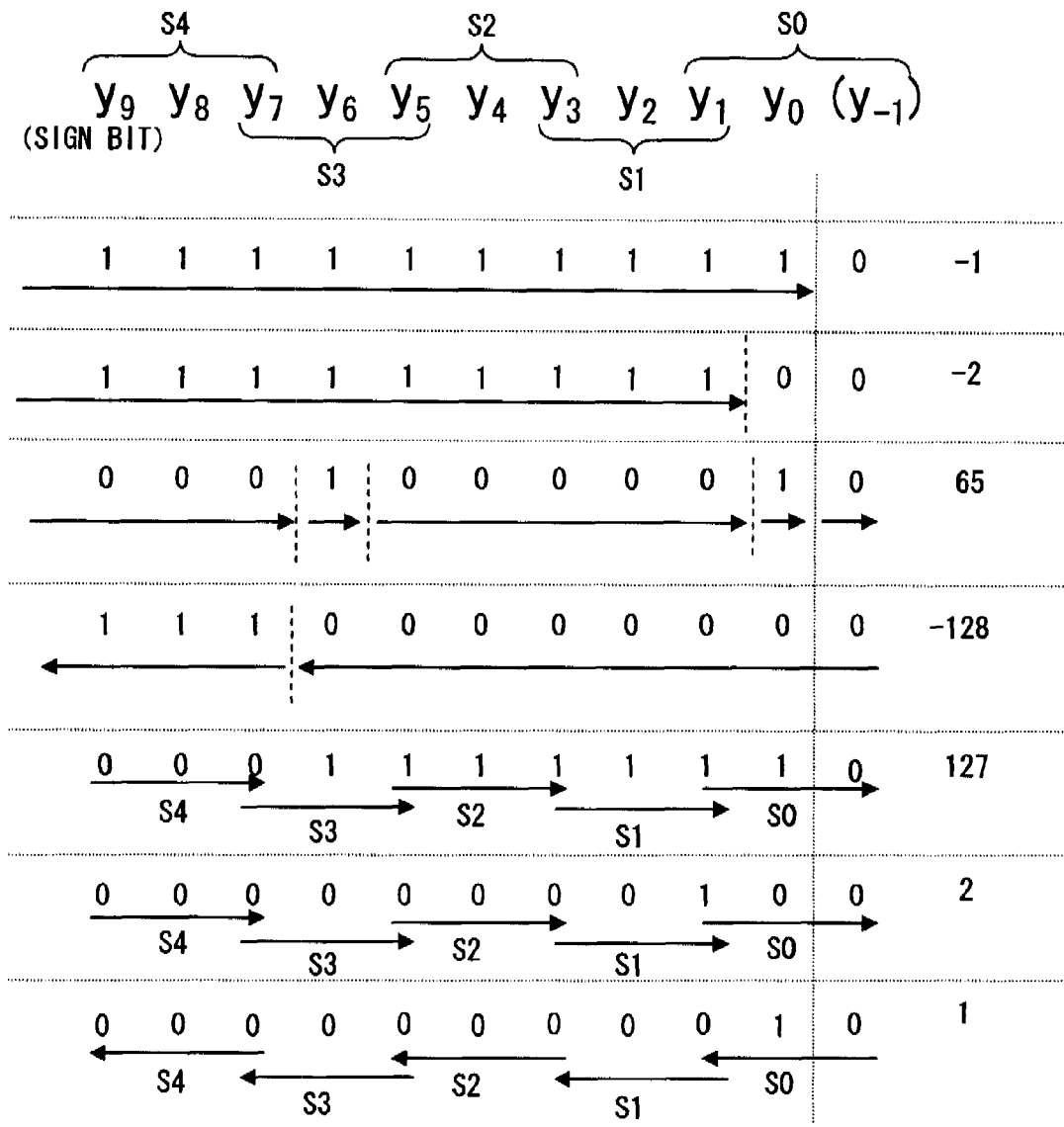
FIG. 9 is a schematic diagram showing 10-bit image data.

Next, based on the value held in the Fs 14, the repeat count determination section 19 determines the number of repetitions of the operation performed by the partial product generator 17. The number of repetitions of the operation is determined by the repeat count determination section 19 as described below. FIG. 9 is a schematic diagram showing 10-bit image data. FIGS. 10A to 10C are diagrams each showing the configuration of the repeat count determination section 19. Referring first to FIG. 9, it is assumed that the image data includes 10 bits $y_0$ to $y_9$ (where $y_9$ represents sign bit). As described above, according to Booth's algorithm, the image data (multiplier Y) is divided into sets of two bits, and code data is obtained from data groups S0 to S4 each including two bits of each set and the most significant bit of a low-order set. The group including $y_0$ and $y_1$ is set as the data group S0 assuming that a bit $y_{-1}=0$.

In the 10-bit data, −1 is represented by $(y_9 y_8 y_7 y_6 y_5 y_4 y_3 y_2 y_1 y_0 y_{-1})=(11111111110)$, and −2 is represented by (11111111100), for example.

The code data is obtained as a result of $y_{2i-1}+y_{2i-2}y_{2i+1}$. When all the three bits constituting each data group have the same signs, that is, (111) or (000), the code data is "0". In other words, since the value output from the Booth encoder 16 is "0", the partial product inevitably becomes "0", which eliminates the necessity of the arithmetic operation. According to an exemplary embodiment of the present invention, by omitting the arithmetic operation for the data group including the code data of "0", the number of repetitions of the operation performed by the partial product generator 17 is reduced.

To determine the number of repetitions of the operation, the following methods can be employed. For example, the number of repetitions is determined according to a sequence of 10 bits. A table of repeat counts correlated with the sequences of 10 bits, is prepared in advance. Then, the repeat count is output by referring to a table 41 shown in FIG. 10A.

Further, there is a method of detecting a change point at which the sign changes, by discriminating the signs from the most significant bit. For example, as shown in FIG. 9, in the case of −1, each value of the high-order bits $y_9$ to $y_0$ is 1, and the value of $y_{-1}$ is 0. Accordingly, the change point is included in the data group S0. In this case, it is only necessary to perform the arithmetic operation for the data group S0, and the repeat count is one. In the case of −2, each value of the high-order bits $y_9$ to $y_1$ is 1, and the value of $y_0$ is 0. Accordingly, the change point is included in the data group S0. Also in this case, it is only necessary to perform the arithmetic operation for the data group S0, and the repeat count is one. In the case of 65, each value of the high-order bits $y_9$ to $y_7$ is 0, and the value of $y_6$; is 1. Accordingly, the change point is included in the data group S3. In this case, it is only necessary to perform arithmetic operations for four data groups S0 to S3, and the repeat count is four.

Furthermore, also regarding the case of 65, there can be employed a method of continuously searching change points for all the bits from the most significant bit to the least significant bit, even after the change point is detected once. In this case, there is another change point between the bits $y_6$ and $y_5$, and each value of $y_5$ to $y_1$ is 0. In addition, there are other change points between the bits $y_1$ and $y_0$ and between the bits $y_0$ and $y_{-1}$. Only the data groups S3 and S0 include the change point in this case, so the repeat count is two. In the above-mentioned cases, the repeat count is determined at the time when the change point is detected, which makes it possible to determine the repeat count earlier. On the other hand, the method of detecting the change point by searching the change point for all the bits from the most significant bit to the least significant bit enables a reduction in repeat count. In this case, the detection is started from the most significant bit, but the detection may be started from the least significant bit in the case of detecting the change point for all the bits. For example, in the case of −128, since each value of the bits $y_{-1}$ to Y6 is "0" and each value of the bits $y_7$ to $y_9$ is "1", there is a change point between the bits $y_6$ and $y_7$. In this case, it is only necessary to perform the arithmetic operation for the data group S3.

Still further, there can be employed a method of detecting whether each data group is (000) or (111) in order to set a result of the secondary Booth's algorithm to 0. In this case, the detection may be started from the most significant bit or from the least significant bit, and all the bits may be detected at the same time. For example, in the case of 127, the data groups S0 and S3 are operation targets, and the repeat count is two. In the case of 2, only the data group S0 is an operation target, and the repeat count is one. Further, in the case of 1, only the data group S0 is an operation target, and the repeat count is one.

FIG. 10B is a diagram showing an example of a circuit according to an exemplary embodiment of the invention that detects whether each data group is (000) or (111). The 10-bit data is divided into the data groups S0 to S4, and the data groups are input to determination sections 51 to 55, respectively. Then, it is determined whether each input data group is (000) or (111). For example, when the data group is (000) or (111), 0 is output, and if not, 1 is output. A table 56 outputs a repeat count according to an output of each of the determination sections 51 to 55. In this case, information indicative of which data group is to be an operation target (hereinafter, referred to as "data group information") is also output.

FIG. 10C is a diagram showing a specific example of a circuit according to an exemplary embodiment of the invention that determines the repeat count by detecting positions of change points. Image data is input to an FF 61 from the most significant bit. A comparator 62 compares the high-order bit held in the FF 61 with a lower-order bit which is subsequently input. When the bits match each other, "0" is output, for example, and when the bits do not match each other, "1" is output, for example. A counter 63 is a down counter that counts values from 9 to 0. A repeat count determination section 64 outputs a repeat count to each of the MUXs 15 and 18 based on the count value obtained when "1" is input.

As described above, the repeat count determination section 19 outputs at least a repeat count. Further, in the case of detecting whether each data group is (000) or (111) with respect to all the data groups, the repeat count and the data group information indicative of which data group is to be an operation target are output to each of the MUXs 15 and 18.

Upon receiving only the repeat count, the MUX 15 outputs the data groups corresponding to the repeat count to the Booth encoder 16. For example, when the repeat count is three, ($y_1$, $y_0$, 0) is first input, and ($y_3$, $y_2$, $y_1$) is then input. After that, ($y_5$, $y_4$, $y_3$) is input.

Further, upon receiving the repeat count and the data group information, the MUX 15 outputs the data groups to the Booth encoder 16 based on the data group information. For example, in the above-mentioned case of 65, the change points are detected in the data groups S0 and S3. In this case, ($y_1$, $y_0$, 0) is first input, and ($y_7$, $y_6$, $y_5$) is then input.

The Booth encoder 16 and the partial product generator 17 perform the above-mentioned operations. Specifically, the Booth encoder 16 obtains code data from the data groups, and the partial product generator 17 multiplies the code data by a difference A between filter coefficients. Then, the multiplication result is output to the bit shifter 18.

The bit shifter 18 also receives the repeat count in the same manner as the MUX 15. In this case, when the repeat count is one, the bit shit is not carried out (for ×1), and the data is directly output. When the repeat count is two, the data is shifted by two bits (for ×$2^2$) to be output. Likewise, when the repeat count is three, the data is shifted by four bits (for ×$2^4$), and when the repeat count is four, the data is shifted by sixbits (for ×$2^6$). Further, when the repeat count is five, the data is shifted by eight bits (for ×$2^8$) to be output.

Further, when the repeat count and the data group information are input to the bit shifter 18 and the MUX 15, the bit shift is carried out based on the data group information. For example, in the above-mentioned case of 65, the operation result of the data group S0 is directly output without carrying out the bit shift. In the case of the arithmetic operation for the data group S3 at the subsequent timing, a value obtained by shifting the data by six bits is output.

In the filter multiplier units 10b, 10c, and 10d, the adder 20 cumulatively adds the output from the bit shifter 18 and the previously output value held in the register 22, and stores the cumulative addition result in the register 22 repeatedly until the repeat operation is completed. In short, the register 22 stores the difference between the current input data and the previous data, and the multiplication result of the difference between the coefficients. The selector 21 selects 0 in the case of a first repeat operation, and outputs the value of the register 22 in other cases. The adder 20 adds the partial products obtained from each of the data groups S0 to S4, thereby obtaining (difference between current pixel data and previous pixel data)×(difference between filter coefficients).

Next, the adder 23 adds the output from the bit shifter 18 or the register 22, and the value held in the register 25. The value of the register 25 corresponding to the adjacent filter multiplier unit is first input. For example, the register 25 corresponding to the filter multiplier unit 10b stores P1×(input data) to be input to the selector 24 corresponding to the filter multiplier unit 10c. The selector 24 selects the value and holds the value in the register 25. The adder 23 calculates and outputs (P2−P1)×(input data). By adding the data to P1× (input data) stored in the register 25, P2×(input data) is selected by the selector 24 and stored in the register 25. The P2×(input data) is output to the adder 26 and input to the selector 23 of the adjacent filter multiplier unit 10d. Thus, the difference between the filter coefficients is input as the multiplicand A, and the difference is cumulatively added, with the result that the register 25 stores the cumulative addition result of the multiplication result of the input data (input data from register Fp11)×(difference between filter coefficients). According to an exemplary embodiment of the present invention, both the filter coefficients and the input data are calculated after obtaining the difference, which results in the reduction in the amount of operations.

The adder 26 adds the coefficient B and also adds the value of the register 25 and the value of the register 27, if necessary. As a result, the register 27 stores the multiplication result of the input data and the filter coefficient.

Figure 11:
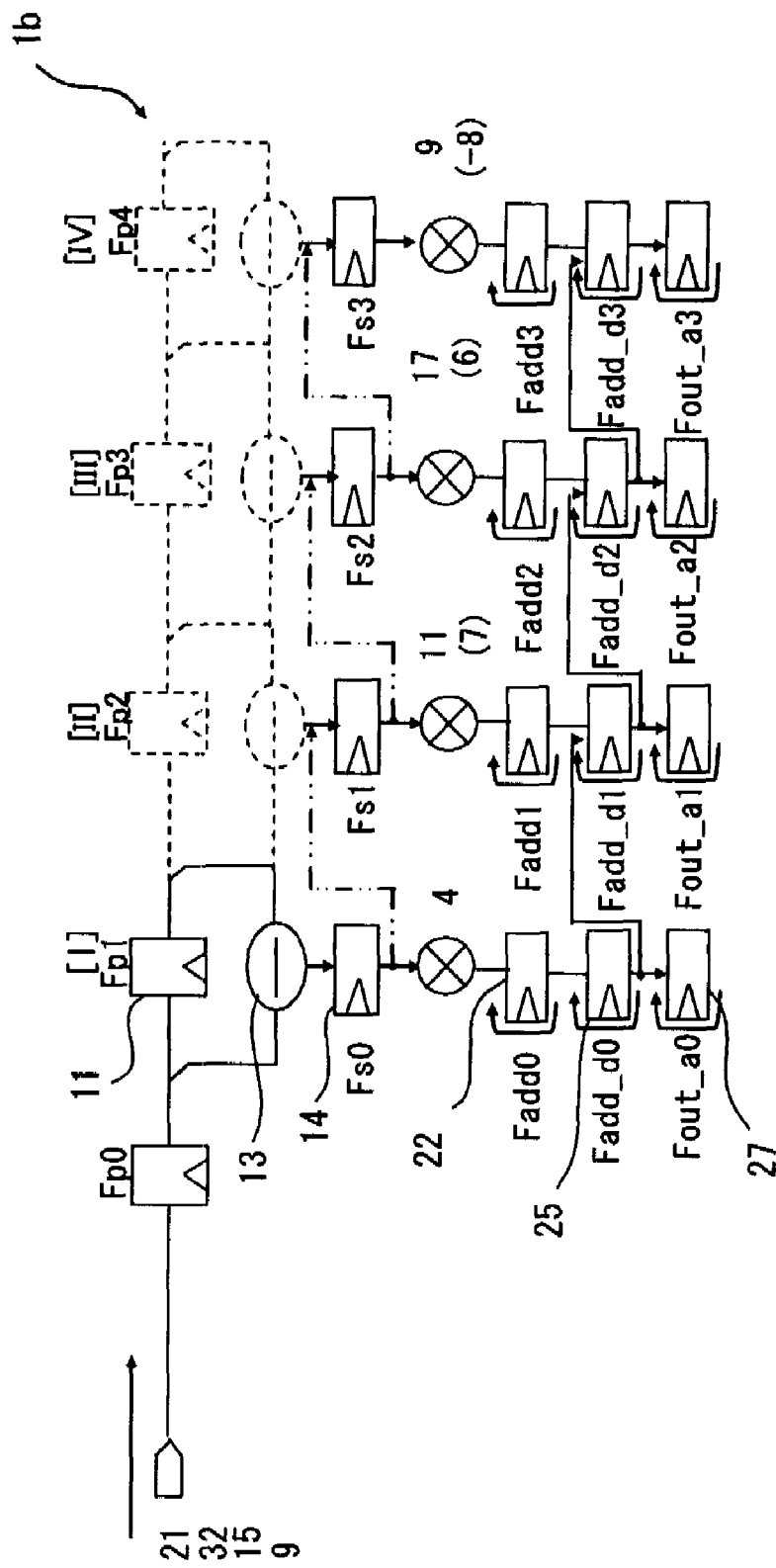
FIG. 11 is a diagram showing a filter operation unit according to a modified example of an exemplary embodiment of the present invention.
Figure 12:
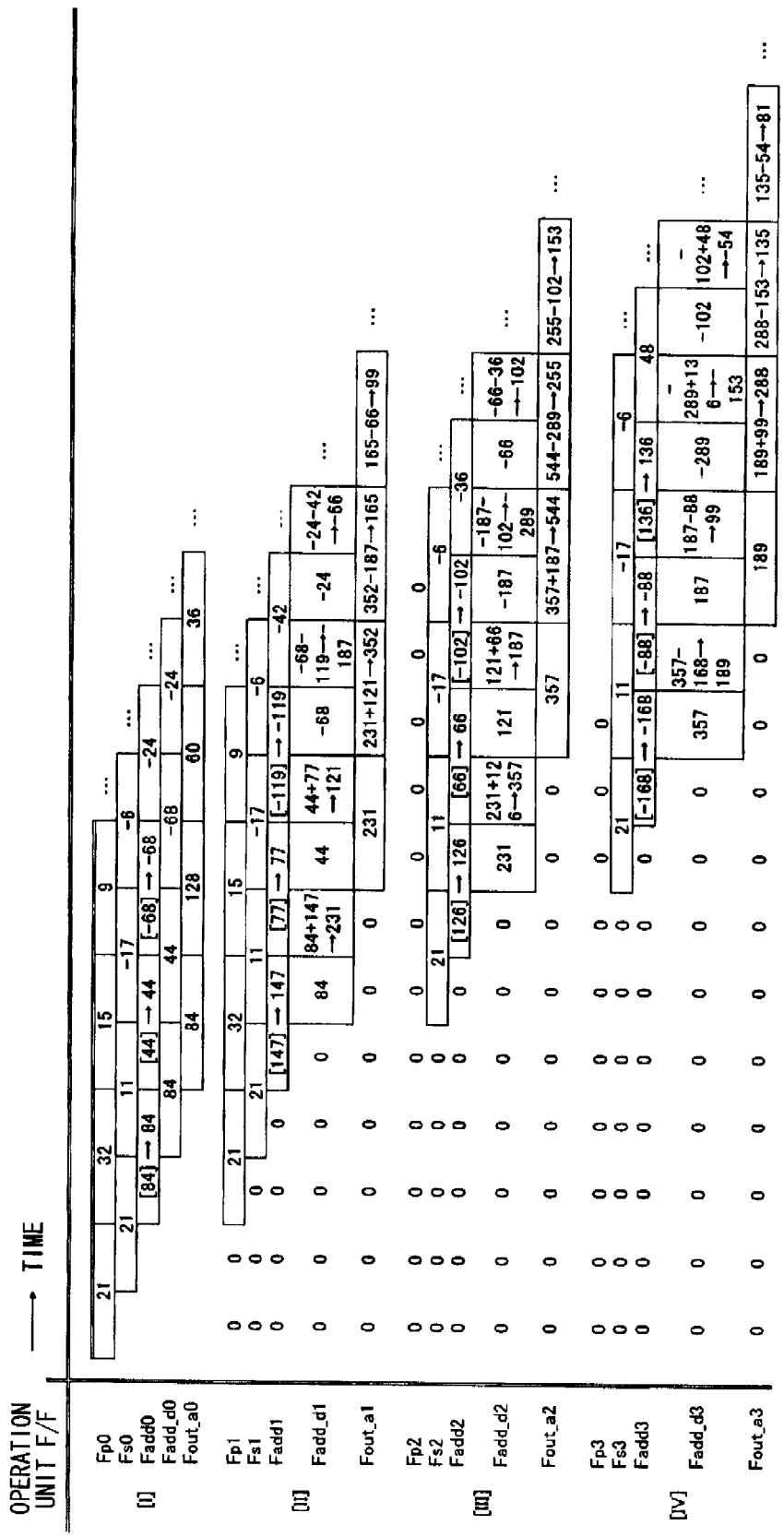
FIG. 12 is a diagram showing an operation timing of the filter operation unit according to an exemplary embodiment of the present invention.
Figure 13:
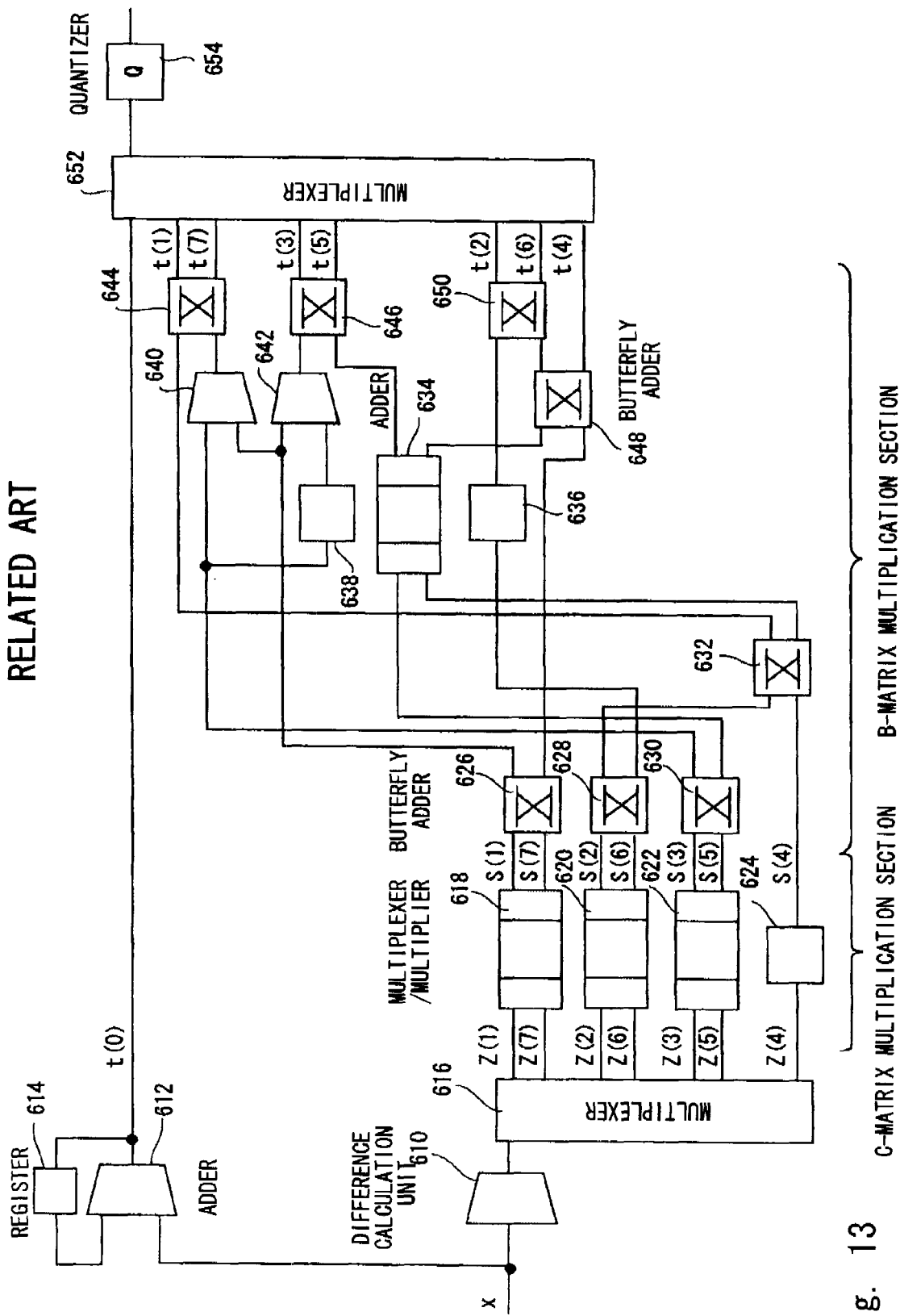
FIG. 13 is a diagram showing a discrete cosine transformer disclosed in Japanese Unexamined Patent Application Publication No. 6-44291.

Next, a description is given of an operation timing of the filter operation unit 1 according to an exemplary embodiment of the present invention. FIG. 11 shows the filter operation unit according to an exemplary embodiment of the present invention, and FIG. 12 shows the operation timing of the filter operation unit 1 according to an exemplary embodiment of the present invention. Referring to FIG. 11, the components other than the subtracter 13 and the registers 11, 14, 22, 25, and 27 are omitted. In a filter operation unit 1b, the register 11 and the subtracter 13 provided in the filter multiplier units subsequent to the first-stage multiplier unit can be omitted as described above. In other words, as shown in FIG. 12, two registers Fp0 and Fp1 may be used instead of the input register 11. Note that, in this case, it is necessary to provide a path for directly transferring the difference in input data, which is held in the register 14, to the register 14 of the subsequent stage. Accordingly, it is possible to reduce the number of input flip-flops (registers) arranged in series with each other, while such flip-flops are indispensable for a method of the related art (Japanese Patent Application No. 2006-313037).

Each of Fs0 to Fs3 corresponds to the register 14 of the filter multiplier units 10a to 10d. Each of Fadd0 to Fadd3 corresponds to the register 22 of the filter multiplier units 10a to 10d. Each of Fadd_d0 to Fadd_d3 corresponds to the register 25 of the filter multiplier units 10a to 10d. Each of Fout_a0 to Fout_a3 corresponds to the register 27 of the filter multiplier units 10a to 10d.

Hereinafter, a description is given of a case where the filter operation unit 1 receives input data 21, 32, 15, and 9 to be multiplied by filter coefficients 4, 11, 17, and 9, respectively. The input data 21, 32, 15, 9 are sequentially input to the Fp0 and Fp1. The Fp1 to Fp0 are sequentially input to the Fs0. The Fadd0 receives a value obtained by multiplying Fs0 by 4. Since the filter multiplier unit 10a is the first-stage filter multiplier unit, the value of Fadd0 is input to the Fadd_d0 and Fout_a0. On the other hand, the Fp2 to Fp1 are sequentially input to the Fs1. The Fadd1 receives a value obtained by multiplying Fs1 by 11−4=7. The Fadd_dl receives the value of Fadd_d0, and further receives a value obtained by adding the value and the value of Fadd1 at the subsequent timing. The same is applied to the filter multiplier units 10c and 10d.

According to an exemplary embodiment of the present invention, in the filter operation, a difference between filter coefficients is obtained, and the difference is multiplied by input data, thereby making it possible to reduce the number of repetitions of the operation. Further, since adjacent pixels of image data are relatively correlated with each other, the difference between the pixels is relatively small. By utilizing this fact, the filter operation is performed such that differences between current data and next data of the input image data are multiplied by filter coefficients, and the multiplication results are added to each other. In this case, the input data obtained after calculating the difference becomes a value close to 0, so the number of repetitions of the operation can be drastically reduced. Furthermore, data from an external memory is generally transferred in bursts, and thus data is not always input continuously. In other words, even if the repeat operation is necessary, the operation can be carried out during a waiting time for data input.

Accordingly, in an exemplary embodiment of the invention, the use of a small partial product generator enables a large reduction in circuit size. Further, when a difference between the filter coefficients is small and a difference between previous data and current data is small, data can be output substantially continuously. Furthermore, even if the difference becomes exceptionally large and the number of repetitions of the operation increases, processing times are not prolonged because waiting time during data transfer can be used. Moreover, the reduction in circuit size leads to a reduction in power consumption.

It is apparent that the present invention is not limited to the above exemplary embodiments, but may be modified and changed without departing from the scope and spirit of the invention. For example, exemplary embodiments of the present invention have been described as a hardware configuration, but the configuration is not limited thereto. Alternatively, arbitrary processing can be realized by causing a central processing unit (CPU) to execute a computer program. In this case, the computer program can be recorded in a recording medium or can be transmitted via the Internet or other transmission media. Accordingly, the scope of the claims is not limited by the exemplary embodiments described above.

What is claimed is:

1. A filter operation unit comprising:
by using a programmable device executing:
at least two filter multiplier units that multiply input data and a difference between adjacent filter coefficients in a filter coefficient group to obtain multiplication results; and
a first adder that adds the multiplication results of the filter multiplier units adjacent to each other,
wherein the at least two filter multiplier units each comprise:
a partial product generation unit that repeatedly generates a partial product according to Booth's algorithm; and
a second adder that cumulatively adds the partial products generated by the partial product generation unit.

2. The filter operation unit according to claim 1, wherein the partial product generation unit comprises:
a partial product multiplication section that multiplies a subtraction result obtained by taking a difference between current data and previous data, and the difference between the adjacent filter coefficients in the filter coefficient group, to obtain a multiplication result;
a repeat count determination section that determines a number of multiplications to be performed by the partial product multiplication section based on the subtraction result; and
a third adder that cumulatively adds the multiplication results of the partial product multiplication section.

3. The filter operation unit according to claim 2, wherein the repeat count determination section determines the number of multiplications to be performed by the partial product multiplication section by searching high-order bits of the subtraction result for positions at which a bit value changes.

4. The filter operation unit according to claim 2, wherein the repeat count determination section determines the number of multiplications to be performed by the partial product multiplication section by searching all bits of the subtraction result from a least significant bit to a most significant bit for positions at which a bit value changes.

5. The filter operation unit according to claim 2, wherein the repeat count determination section divides the subtraction result into sets of two bits from a least significant bit to form groups of three bits in total including two bits of each set and a most significant bit of a low-order set, judges whether all bit values of each group are identical to each other, and determines the number of multiplications to be performed by the partial product multiplication section based on a result of the judgment.

6. The filter operation unit according to claim 2, wherein the repeat count determination section divides the subtraction result into sets of two bits from a least significant bit to form groups of three bits in total including two bits of each set and a most significant bit of a low-order set; searches for a change point at which a bit value changes in each group, for all bits from a least significant bit to a most significant bit of the subtraction result; and determines the number of multiplications to be performed by the partial product multiplication section based on a result of the search.

7. The filter operation unit according to claim 2, wherein the repeat count determination section outputs the number of multiplications to be performed by the partial product multiplication section as well as sequence information indicative of a position of the group including a change point at which a bit value changes, from a least- significant bit group, when the subtraction result is divided into sets of two bits from a least significant bit to form groups of three bits in total including two bits of each set and a most significant bit of a low-order set.

8. The filter operation unit according to claim 2, wherein the partial product multiplication section comprises:
a data selector that selects bits from the subtraction result;
a Booth encoder that obtains code data from the bits selected by the data selector;
a partial product generator that multiplies the code data obtained by the Booth encoder and the difference between the adjacent filter coefficients in the filter coefficient group to generate a partial product; and
a bit shifter that shifts the partial product generated by the partial product generator by predetermined bits.

9. The filter operation unit of claim 2, wherein the current data and the previous data are pixel values of adjacent pixels in an image.

10. A filter operation unit comprising:
by using a programmable device executing:
at least two filter multiplier units that multiply input data and a difference between adjacent filter coefficients in a filter coefficient group to obtain multiplication results; and
a first adder that adds the multiplication results of the filter multiplier units adjacent to each other, wherein:
the at least two filter multiplier units each comprise:
a first multiplier unit; and
a second multiplier unit connected to the first multiplier unit;
the first multiplier unit comprising:
a subtracter that obtains a subtraction result by taking a difference between current data and previous data;
a first partial product multiplication section that multiplies the subtraction result obtained by the subtracter, and the difference between the adjacent filter coefficients in the filter coefficient group;
a first repeat count determination section that determines the number of multiplications to be performed by the first partial product multiplication section based on the subtraction result; and
a first adder that cumulatively adds the multiplication results of the first partial product multiplication section; and
the second multiplier unit comprising:
a second partial product multiplication section that multiplies the subtraction result obtained by the first multiplier unit, and the difference between the adjacent filter coefficients in the filter coefficient group;
a second repeat count determination section that determines the number of multiplications to be performed by the second partial product multiplication section based on the subtraction result; and
a second adder that cumulatively adds the multiplication results of the second partial product multiplication section.

11. The filter operation unit of claim 10, wherein the current data and the previous data are pixel values of adjacent pixels in an image.

12. A motion-compensating device that generates a predicted image, comprising:
a first filter operation section that filters input data in a vertical direction;
a second filter operation section that filters the input data in a horizontal direction; and
a weighting operation section that weights one of an operation result of each of the first filter operation section and the second filter operation section, and the input data input to each of the first filter operation section and the second filter operation section, wherein:
the first filter operation section and the second filter operation section each comprise:
at least two filter multiplier units that multiply the input data and a difference between adjacent filter coefficients in the filter coefficient group to obtain multiplication results; and
an adder that adds the multiplication results of the multiplier units adjacent to each other; and
the at least two filter multiplier units each comprise:
a partial product generation unit that repeatedly generates a partial product according to Booth's algorithm; and
an adder that cumulatively adds the partial products generated by the partial product generation unit.

* * * * *